US012563803B2

(12) United States Patent
Jang et al.

(10) Patent No.: US 12,563,803 B2
(45) Date of Patent: *Feb. 24, 2026

(54) CUT METAL GATE PROCESSES

(71) Applicant: Taiwan Semiconductor Manufacturing Co., Ltd., Hsinchu (TW)

(72) Inventors: Shu-Uei Jang, Hsinchu (TW); Ya-Yi Tsai, Hsinchu (TW); Ryan Chia-Jen Chen, Hsinchu (TW); An Chyi Wei, Hsinchu (TW); Shu-Yuan Ku, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/638,112

(22) Filed: Apr. 17, 2024

(65) Prior Publication Data

US 2024/0290620 A1 Aug. 29, 2024

Related U.S. Application Data

(63) Continuation of application No. 17/818,600, filed on Aug. 9, 2022, now Pat. No. 11,990,341, which is a (Continued)

(51) Int. Cl.
*H01L 21/28* (2025.01)
*H01L 21/02* (2006.01)
(Continued)

(52) U.S. Cl.
CPC .. *H01L 21/28123* (2013.01); *H01L 21/02164* (2013.01); *H01L 21/32135* (2013.01);
(Continued)

(58) Field of Classification Search
CPC ........... H10D 84/0135; H10D 84/0147; H10D 84/0151; H10D 84/0158; H10D 84/038;
(Continued)

(56) References Cited

U.S. PATENT DOCUMENTS 6,284,664 B1 9/2001 Kawai
6,653,212 B1 11/2003 Yamanaka et al.
(Continued)

FOREIGN PATENT DOCUMENTS

CN 103107198 A 5/2013
CN 105845578 A 8/2016
(Continued)

*Primary Examiner* — Syed I Gheyas
(74) *Attorney, Agent, or Firm* — Slater Matsil, LLP

(57) ABSTRACT

A method of forming a semiconductor device includes etching a gate stack to form a trench extending into the gate stack, forming a dielectric layer on a sidewall of the gate stack, with the sidewall exposed to the trench, and etching the dielectric layer to remove a first portion of the dielectric layer at a bottom of the trench. A second portion of the dielectric layer on the sidewall of the gate stack remains after the dielectric layer is etched. After the first portion of the dielectric layer is removed, the second portion of the dielectric layer is removed to reveal the sidewall of the gate stack. The trench is filled with a dielectric region, which contacts the sidewall of the gate stack.

20 Claims, 38 Drawing Sheets

Related U.S. Application Data continuation of application No. 16/927,031, filed on Jul. 13, 2020, now Pat. No. 11,508,582, which is a continuation of application No. 16/182,772, filed on Nov. 7, 2018, now Pat. No. 10,714,347.

(60) Provisional application No. 62/751,067, filed on Oct. 26, 2018.

(51) Int. Cl.

| | |
|---|---|
| *H01L 21/3213* | (2006.01) |
| *H01L 21/762* | (2006.01) |
| *H10D 30/01* | (2025.01) |
| *H10D 64/01* | (2025.01) |
| *H10D 84/01* | (2025.01) |
| *H10D 84/03* | (2025.01) |

(52) U.S. Cl.
CPC ..... *H01L 21/76224* (2013.01); *H10D 30/024* (2025.01); *H10D 64/017* (2025.01); *H10D 84/0135* (2025.01); *H10D 84/0147* (2025.01); *H10D 84/0151* (2025.01); *H10D 84/0158* (2025.01); *H10D 84/038* (2025.01)

(58) Field of Classification Search
CPC ............ H10D 30/797; H01L 21/28123; H01L 21/02164; H01L 21/32135; H01L 21/76224
See application file for complete search history.

(56) References Cited

U.S. PATENT DOCUMENTS

| | | | |
|---|---|---|---|
| 8,912,610 | B2 | 12/2014 | Lin et al. |
| 9,311,074 | B2 | 4/2016 | Nishikawa |
| 9,537,016 | B1 | 1/2017 | Lu et al. |
| 9,601,567 | B1 | 3/2017 | Hsieh |
| 9,761,684 | B2 | 9/2017 | Huang et al. |
| 9,818,872 | B2 | 11/2017 | Ching et al. |
| 9,935,103 | B2 | 4/2018 | Chang et al. |
| 10,373,873 | B1 * | 8/2019 | Park .................... H10D 64/017 |
| 10,418,285 | B1 * | 9/2019 | Zang .................... H10D 84/038 |
| 10,714,347 | B2 | 7/2020 | Jang et al. |
| 2005/0275046 | A1 | 12/2005 | Goldbach et al. |
| 2008/0182382 | A1 * | 7/2008 | Ingle ................ H01L 21/31116 257/E21.546 |
| 2011/0151676 | A1 | 6/2011 | Ingle et al. |
| 2012/0196447 | A1 | 8/2012 | Yang et al. |
| 2013/0285141 | A1 | 10/2013 | Kuo et al. |
| 2015/0270401 | A1 * | 9/2015 | Huang .................. H10D 30/62 257/192 |
| 2016/0064519 | A1 | 3/2016 | Yang et al. |
| 2016/0379839 | A1 | 12/2016 | Hsu et al. |
| 2018/0182857 | A1 | 6/2018 | Chang et al. |
| 2019/0067115 | A1 | 2/2019 | Park et al. |
| 2019/0096751 | A1 | 3/2019 | Sato et al. |
| 2019/0348330 | A1 | 11/2019 | Chang et al. |

FOREIGN PATENT DOCUMENTS

| | | | |
|---|---|---|---|
| CN | 106206436 | A | 12/2016 |
| CN | 107068685 | A | 8/2017 |
| KR | 20060048332 | A | 5/2006 |
| KR | 20080052500 | A | 6/2008 |
| KR | 20100098012 | A | 9/2010 |
| KR | 20160086737 | A | 7/2016 |
| KR | 101809350 | B1 | 12/2017 |

* cited by examiner

CUT METAL GATE PROCESSES

PRIORITY CLAIM AND CROSS-REFERENCE

This application is a continuation of U.S. patent application Ser. No. 17/818,600, entitled "Cut Metal Gate Processes," and filed Aug. 9, 2022, which is a continuation of U.S. patent application Ser. No. 16/927,031, entitled "Cut Metal Gate Processes," and filed Jul. 13, 2020, now U.S. Pat. No. 11,508,582, issued Nov. 22, 2022, which is a continuation of U.S. patent application Ser. No. 16/182,772, entitled "Cut Metal Gate Processes," and filed Nov. 7, 2018, now U.S. Pat. No. 10,714,347 issued Jul. 14, 2020, which claims the benefit of the Provisional Application No. 62/751,067, entitled "Cut Metal Gate Processes," filed Oct. 26, 2018, which applications are hereby incorporated herein by reference.

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs, and for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
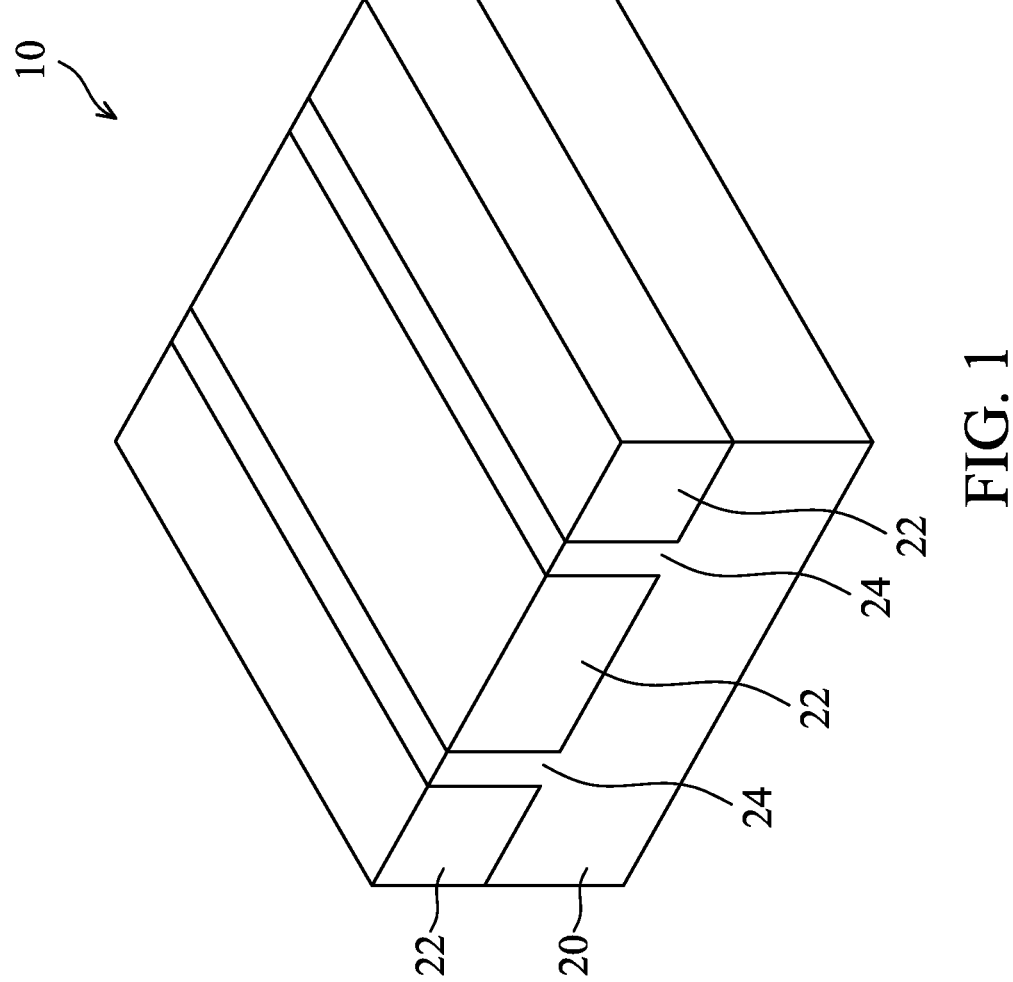
FIGS. 1-5, 6A, 6B, 7A, 7B, 8A, 8B, 9, 10A, 10B, 10C, 11A, 11B, 11C, 12A, 12B, 12C, 13-18, 19A, 19B, 19C, 20A, 20B, 20C, and 21 illustrate the perspective views, top views, and cross-sectional views of intermediate stages in the formation of Fin Field-Effect Transistors (FinFETs) and a cute-metal-gate process in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Fin Field-Effect Transistor (FinFET) formed adopting a cut-metal process, and the methods of forming the same are provided in accordance with some embodiments. The intermediate stages of forming the transistors are illustrated in accordance with some embodiments. Some variations of some embodiments are discussed. Throughout the various views and illustrative embodiments, like reference numbers are used to designate like elements. In accordance with some embodiments, an oxide layer formed in a cut-metal process is removed before forming a dielectric isolation region.

Figure 25:
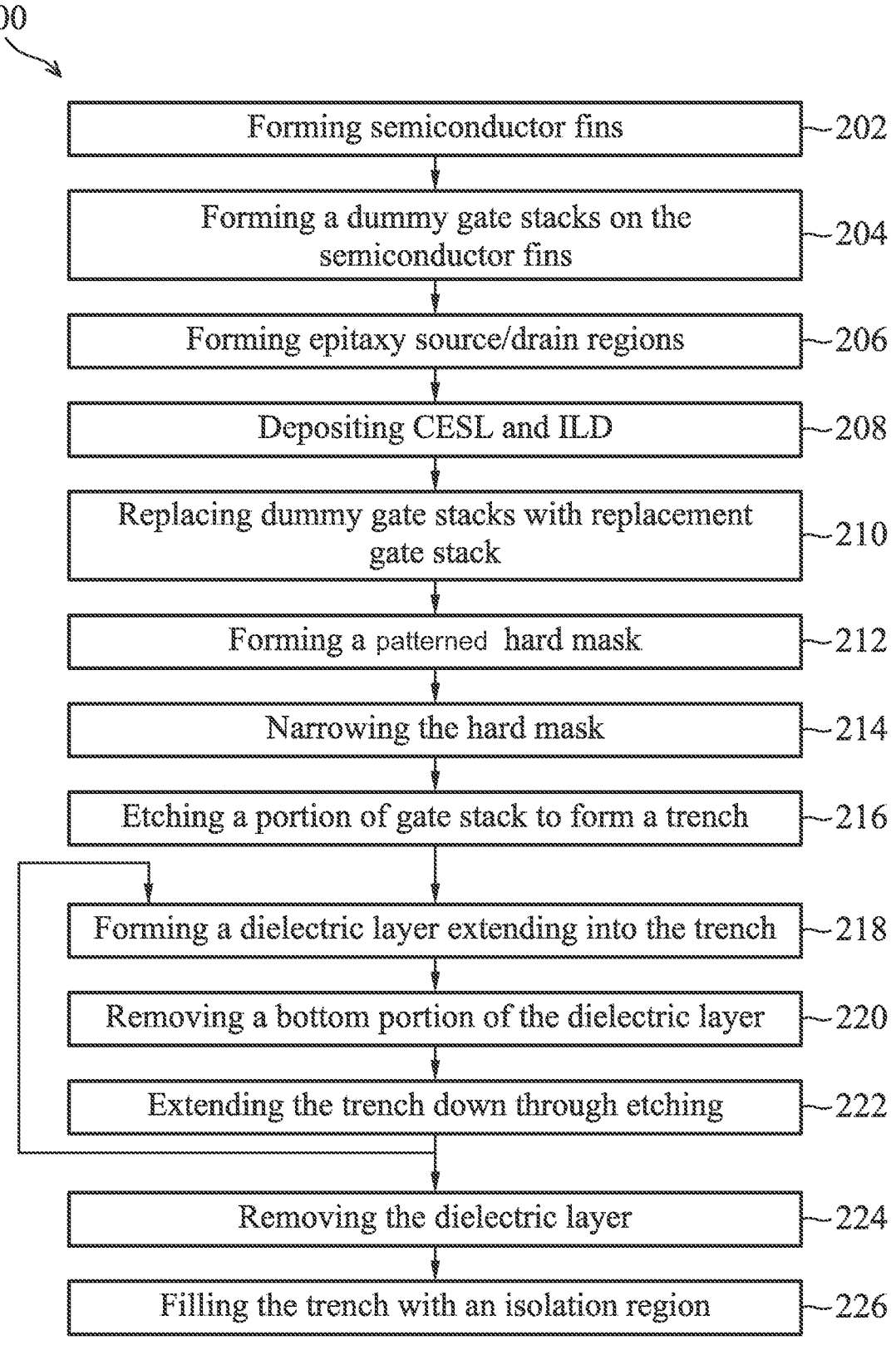
FIG. 25 illustrates a process flow for forming a FinFET and a cute-metal-gate process in accordance with some embodiments.

FIGS. 1-5, 6A, 6B, 7A, 7B, 8A, 8B, 9, 10A, 10B, 10C, 11A, 11B, 11C, 12A, 12B, 12C, 13-18, 19A, 19B, 19C, 20A, 20B, 20C, and 21 illustrate the cross-sectional views, top views, and perspective views of intermediate stages in the formation of FinFETs in accordance with some embodiments of the present disclosure. The processes are also reflected schematically in the process flow 200 as shown in FIG. 25.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The portions of substrate 20 between neighboring STI regions 22 are referred to as semiconductor strips 24. The top surfaces of semiconductor strips 24 and the top surfaces of STI regions 22 may be substantially level with each other in accordance with some embodiments. In accordance with some embodiments of the present disclosure, semiconductor strips 24 are parts of the original substrate 20, and the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy to regrow another semiconductor material in the recesses. Accordingly, semiconductor strips 24 are formed of a semiconductor material different from that of substrate 20. In accordance with some embodiments, semiconductor strips 24 are formed of silicon germanium, silicon carbon, or a III-V compound semiconductor material.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on coating, or the like.

Figure 2:
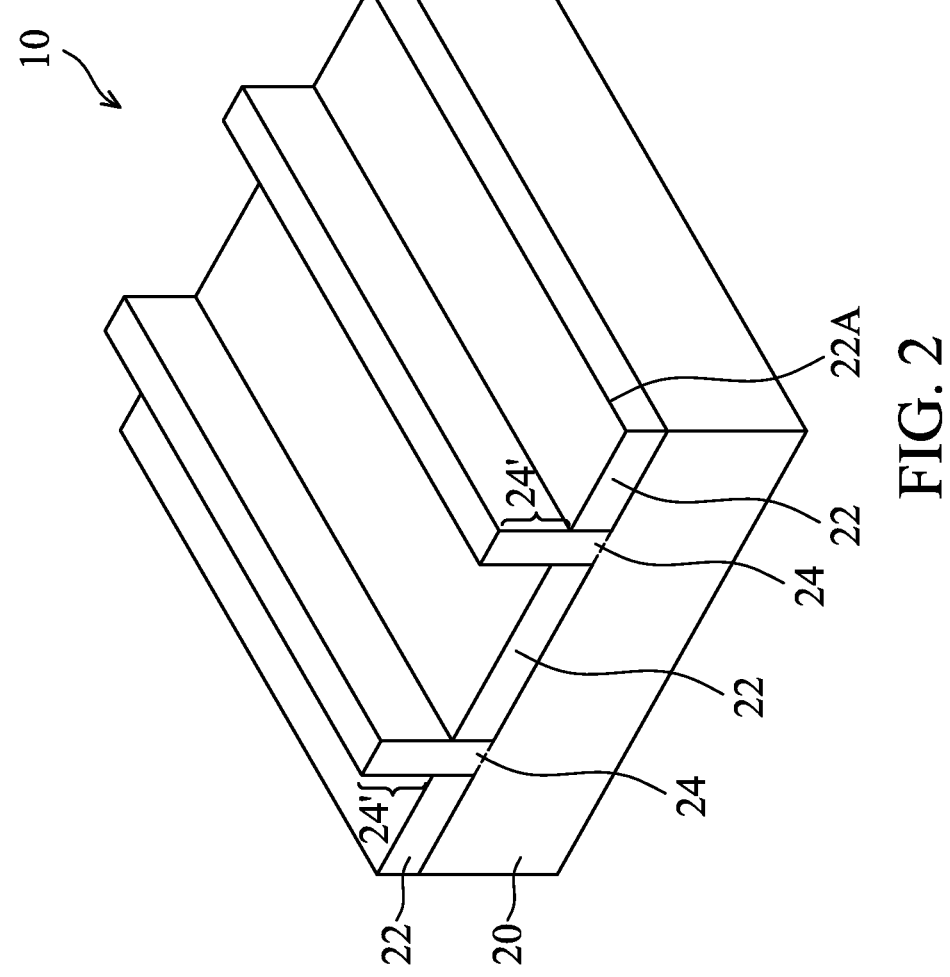

Referring to FIG. 2, STI regions 22 are recessed, so that the top portions of semiconductor strips 24 protrude higher than the top surfaces 22A of the remaining portions of STI regions 22 to form protruding fins 24'. The respective process is illustrated as process 202 in the process flow 200 as shown in FIG. 25. The recessing may be performed using a dry etching process, wherein $HF_3$ and $NH_3$ are used as the etching gases. In accordance with alternative embodiments of the present disclosure, the recessing of STI regions 22 is performed using a wet etch process. The etching chemical may include HF solution, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3:
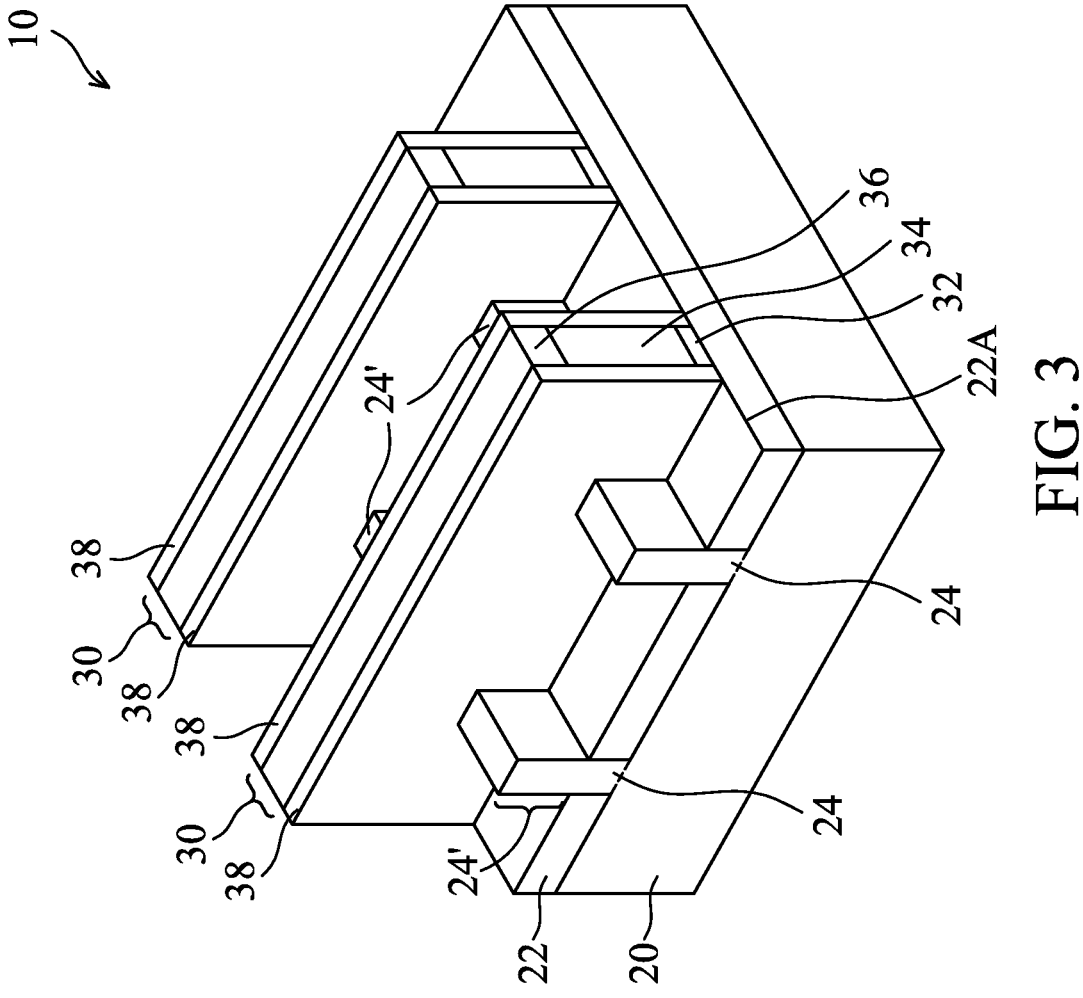

Referring to FIG. 3, dummy gate stacks 30 are formed on the top surfaces and the sidewalls of protruding fins 24'. The respective process is illustrated as process 204 in the process flow 200 as shown in FIG. 25. Dummy gate stacks 30 may include dummy gate dielectrics 32 and dummy gate electrodes 34 over dummy gate dielectrics 32. Dummy gate electrodes 34 may be formed, for example, using polysilicon, and other materials may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, or multi-layers thereof. Dummy gate stacks 30 may cross over a single one or a plurality of protruding fins 24' and/or STI regions 22. Dummy gate stacks 30 also have lengthwise directions perpendicular to the lengthwise directions of protruding fins 24'.

Next, gate spacers 38 are formed on the sidewalls of dummy gate stacks 30. In accordance with some embodiments of the present disclosure, gate spacers 38 are formed of a dielectric material such as silicon nitride, silicon oxide, silicon carbo-nitride, silicon oxynitride, silicon oxy-carbo-nitride, or the like, and may have a single-layer structure or a multi-layer structure including a plurality of dielectric layers.

Figure 4:
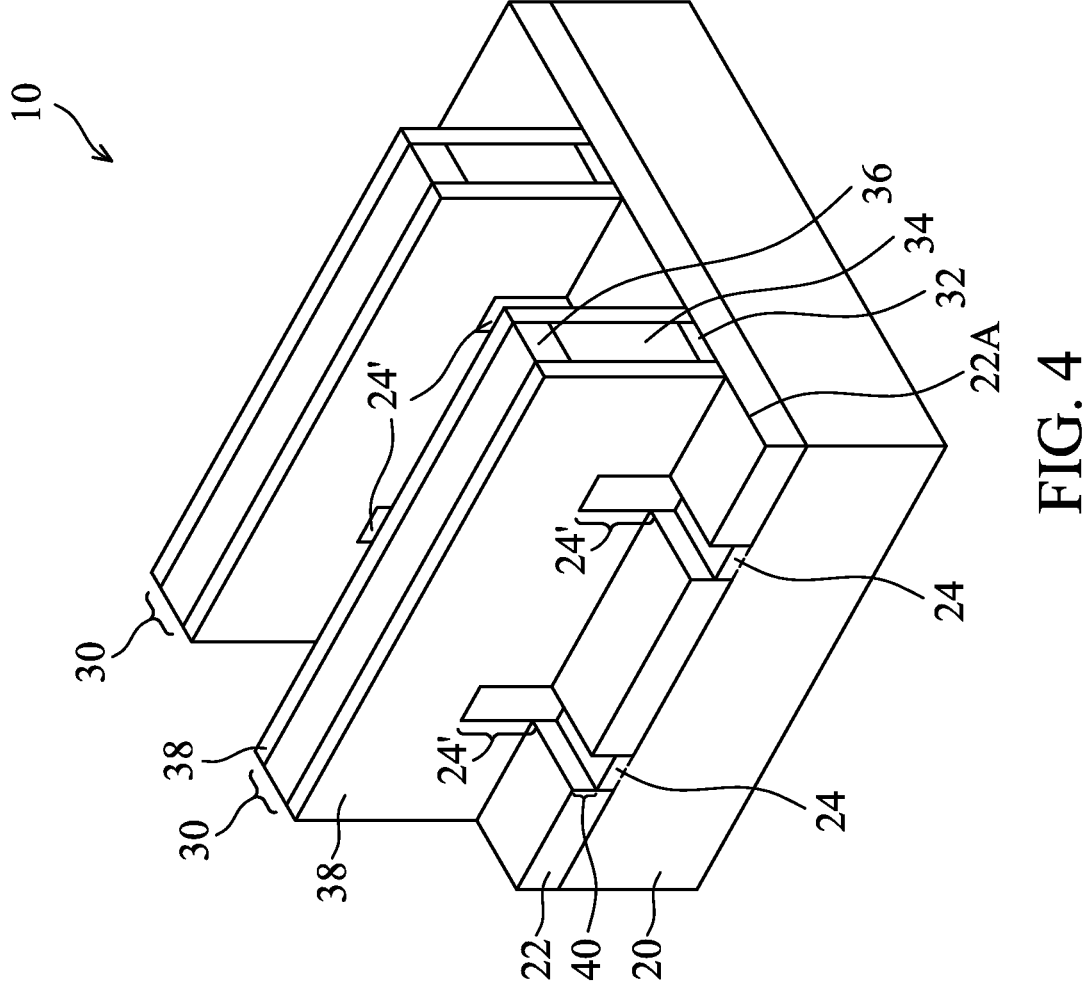

In accordance with some embodiments of the present disclosure, an etching step (referred to as fin recessing hereinafter) is performed to etch the portions of protruding fins 24' that are not covered by dummy gate stack 30 and gate spacers 38, resulting in the structure shown in FIG. 4. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. Recesses 40 are accordingly formed in protruding fins 24', and extending between STI regions 22. Recesses 40 are located on the opposite sides of dummy gate stacks 30.

Figure 5:
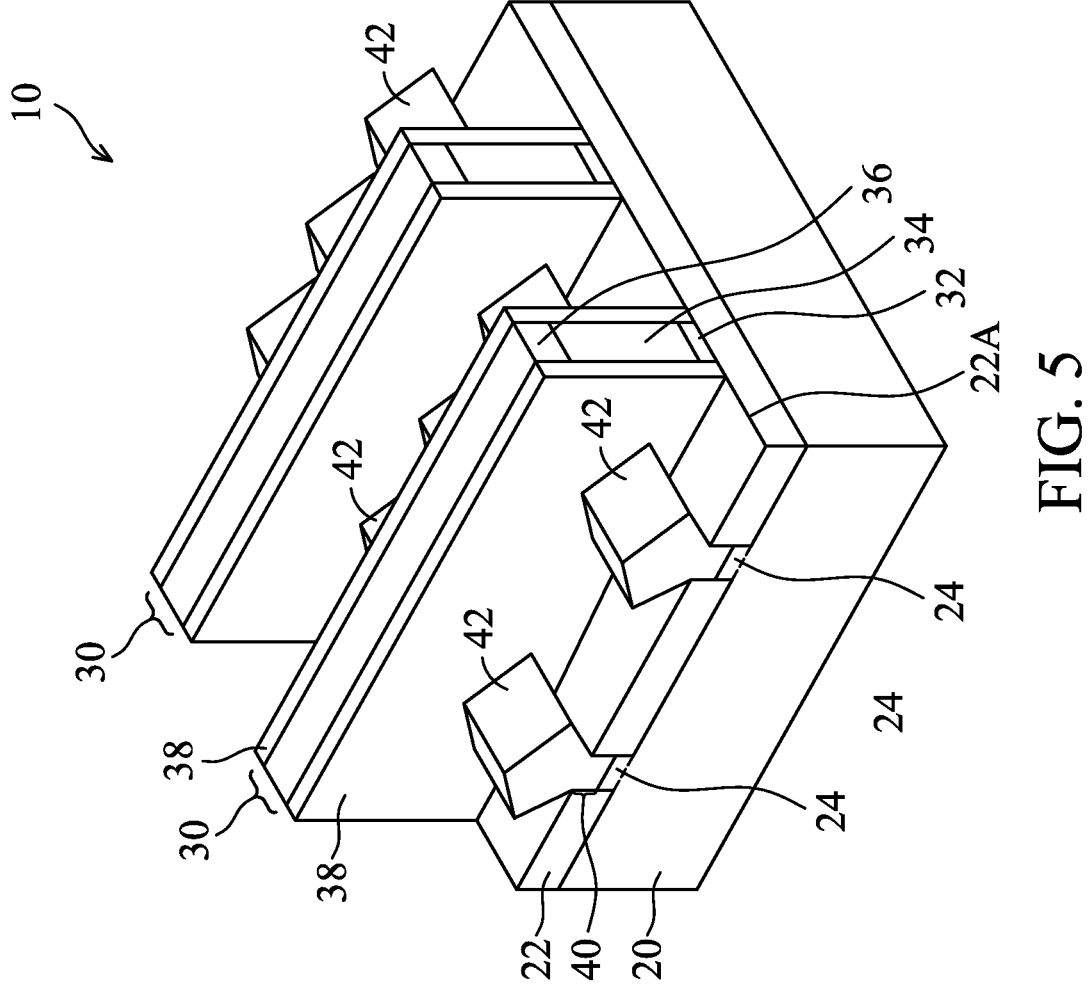

Next, epitaxy regions (source/drain regions) 42 are formed by selectively growing a semiconductor material in recesses 40, resulting in the structure in FIG. 5. The respective process is illustrated as process 206 in the process flow 200 as shown in FIG. 25. In accordance with some embodiments, epitaxy regions 42 include silicon germanium, silicon, or silicon carbon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon boron (SiB), silicon germanium boron (SiGeB), GeB, or the like may be grown. Conversely, when the resulting FinFET is an n-type FinFET, silicon phosphorous (SiP), silicon carbon phosphorous (SiCP), silicon, or the like, may be grown. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 42 fully fill recesses 40, epitaxy regions 42 start expanding horizontally, and facets may be formed. The neighboring epitaxy regions 42 may merge with each other.

After the epitaxy step, epitaxy regions 42 may be further implanted with a p-type or an n-type impurity to form source and drain regions, which are also denoted using reference numeral 42. In accordance with alternative embodiments of the present disclosure, the implantation step is skipped when epitaxy regions 42 are in-situ doped with the p-type or n-type impurity during the epitaxy. Epitaxy source/drain regions 42 include lower portions that are formed in STI regions 22, and upper portions that are formed over the top surfaces of STI regions 22.

Figure 6A:
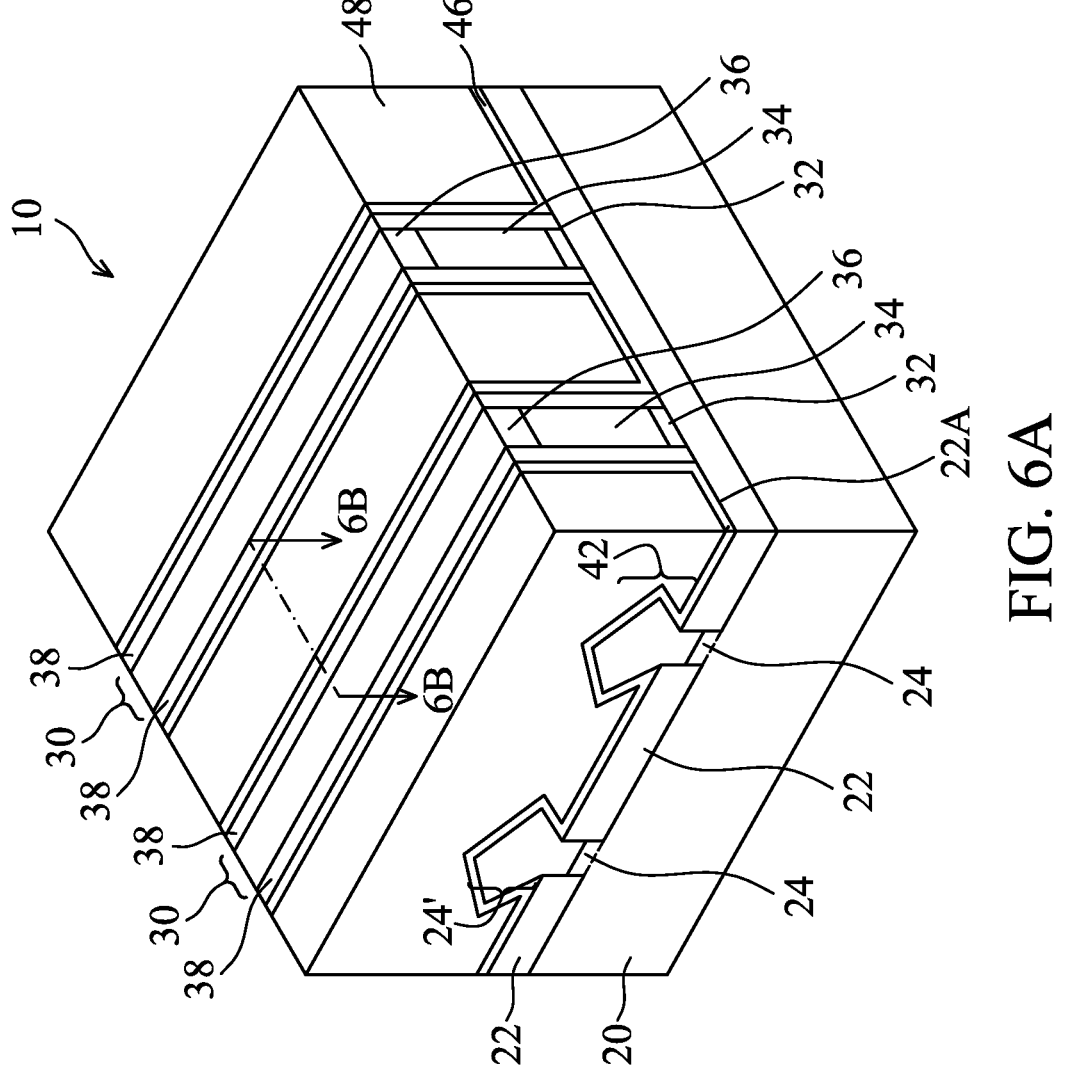

FIG. 6A illustrates a perspective view of the structure after the formation of Contact Etch Stop Layer (CESL) 46 and Inter-Layer Dielectric (ILD) 48. The respective process is illustrated as process 208 in the process flow 200 as shown in FIG. 25. CESL 46 may be formed of silicon oxide, silicon nitride, silicon carbo-nitride, or the like. CESL 46 may be formed using a conformal deposition method such as ALD or CVD, for example. ILD 48 may include a dielectric material formed using, for example, FCVD, spin-on coating, CVD, or another deposition method. ILD 48 may also be formed of an oxygen-containing dielectric material, which may be a silicon-oxide based dielectric such as Tetra Ethyl Ortho Silicate (TEOS) oxide, Plasma-Enhanced CVD (PECVD) oxide (including $SiO_2$), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process is performed to level the top surfaces of ILD 48, dummy gate stacks 30, and gate spacers 38 with each other.

Figure 6B:
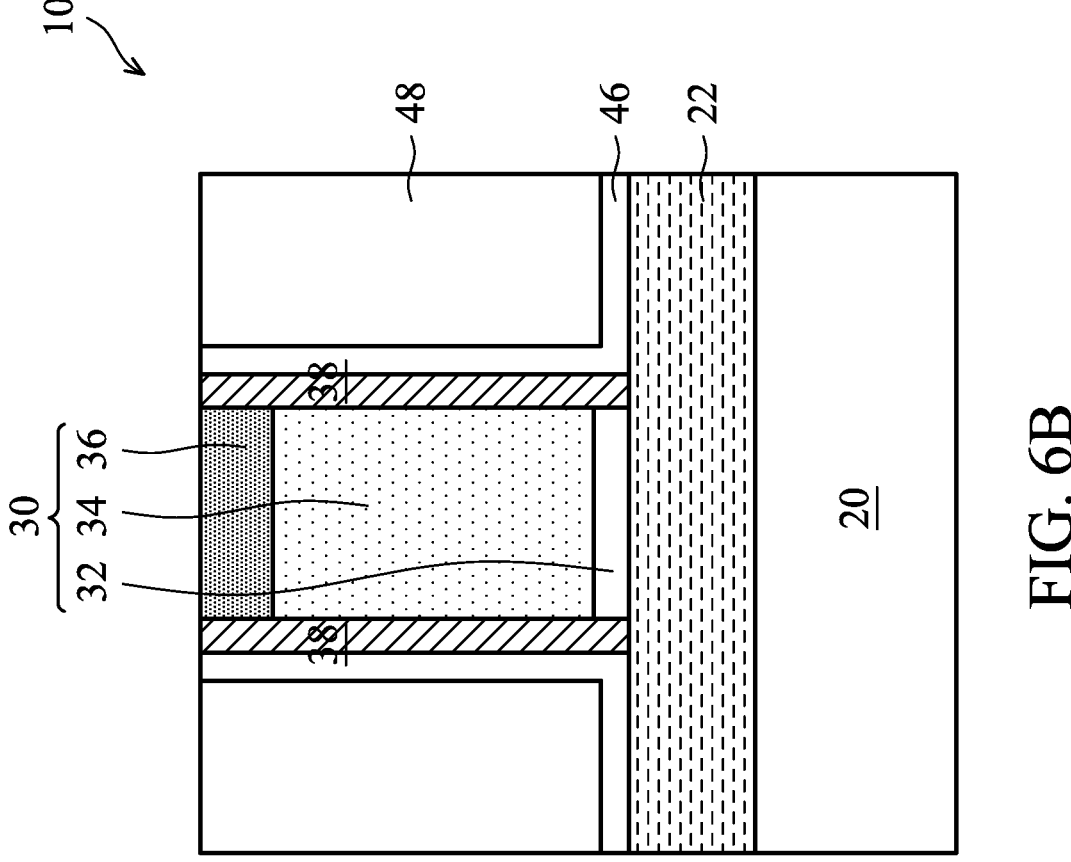

A cross-sectional view of the structure shown in FIG. 6A is illustrated in FIG. 6B. The cross-sectional view is obtained from the vertical plane containing line 6B-6B in FIG. 6A. As shown in FIG. 6B, one of dummy gate stacks 30 is illustrated.

Figure 7A:
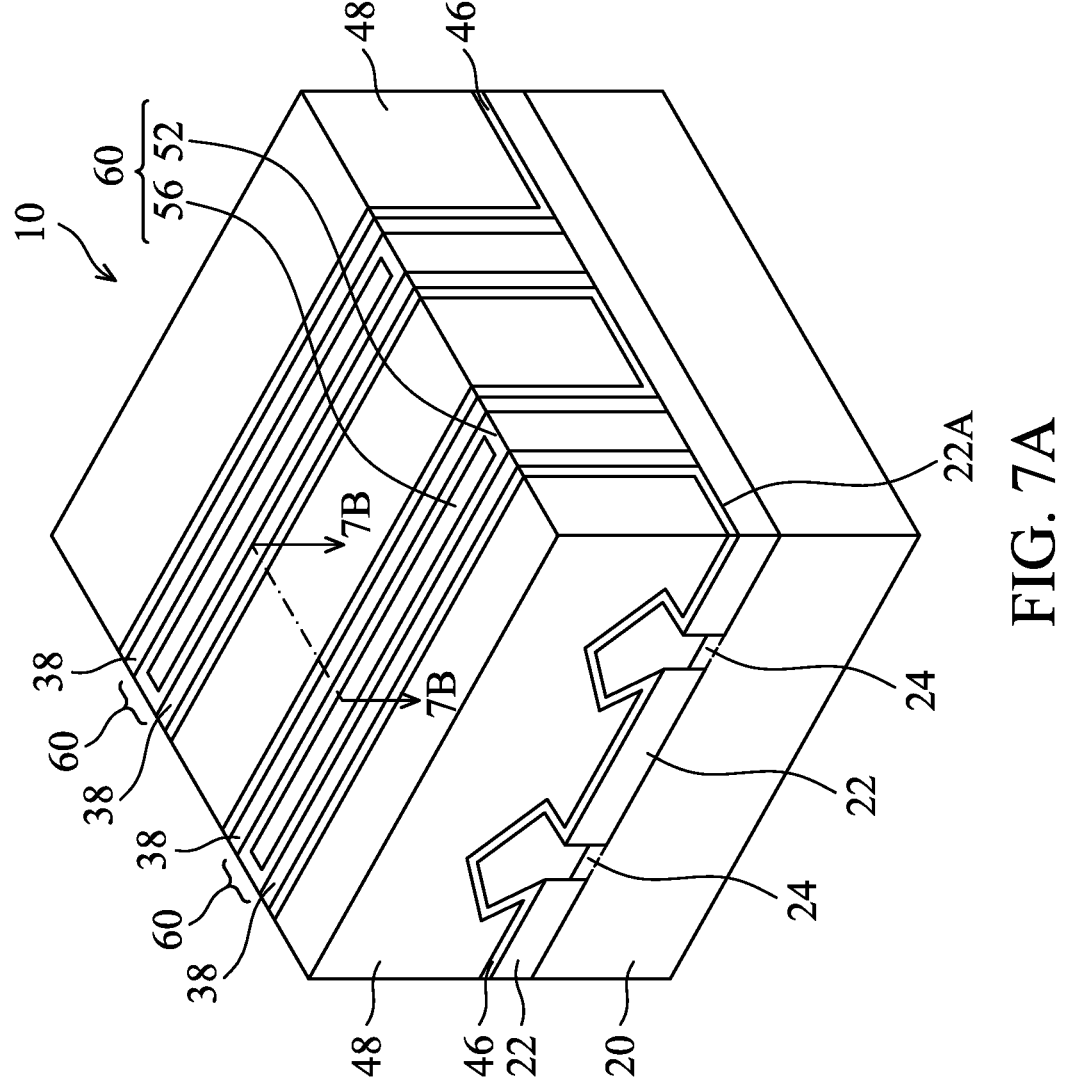
Figure 7B:
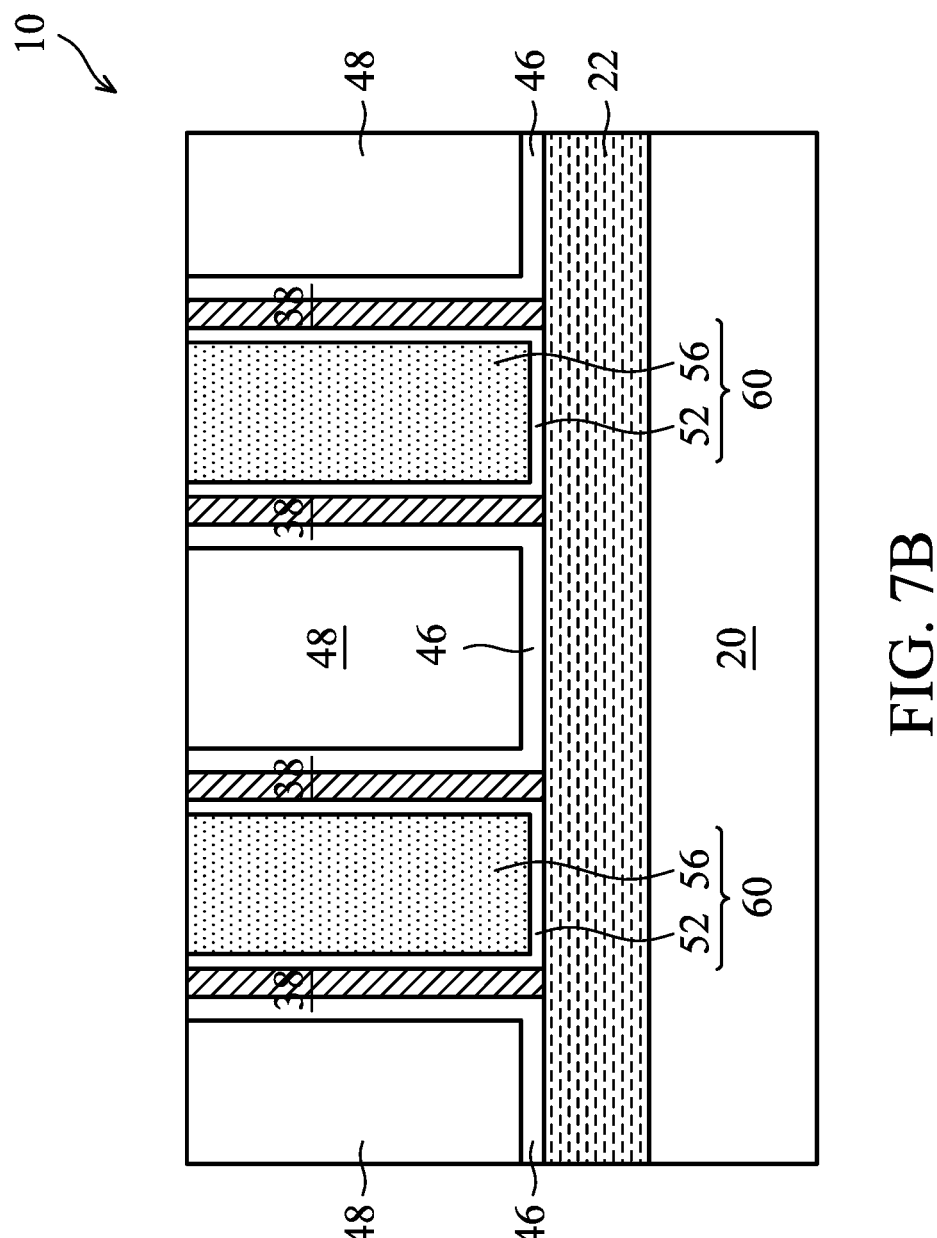

Next, dummy gate stacks 30, which include hard mask layers 36, dummy gate electrodes 34 and dummy gate dielectrics 32, are replaced with replacement gate stacks. The replacement gate stacks include metal gates and replacement gate dielectrics as shown in FIGS. 7A and 7B. FIG. 7B illustrates a cross-sectional view, which is obtained from the vertical plane containing line 7B-7B in FIG. 7A. In accordance with some embodiments of the present disclosure, the replacement process includes etching hard mask layers 36, dummy gate electrodes 34, and dummy gate dielectrics 32 as shown in FIGS. 6A and 6B in one or a plurality of etching steps, resulting in openings to be formed between opposite portions of gate spacers 38.

Next, referring to FIGS. 7A and 7B, (replacement) gate stacks 60 are formed, which include gate dielectric layers 52 and gate electrodes 56. The respective process is illustrated as process 210 in the process flow 200 as shown in FIG. 25. FIG. 7B illustrates the cross-sectional view of gate stack 60. The cross-sectional view is obtained from the vertical plane containing line 7B-7B as shown in FIG. 7A. The formation of gate stacks 60 includes forming/depositing a plurality of layers, and then performing a planarization process such as a CMP process or a mechanical grinding process. Gate dielectric layers 52 extend into the trenches left by the removed dummy gate stacks. In accordance with some embodiments of the present disclosure, each of gate dielectric layers 52 includes an Interfacial Layer (IL, not shown) as its lower part. The ILs are formed on the exposed surfaces of protruding fins 24'. Each of the ILs may include an oxide layer such as a silicon oxide layer, which is formed through the thermal oxidation of protruding fins 24', a chemical oxidation process, or a deposition process. Gate dielectric layer 52 may also include a high-k dielectric layer formed over the IL. The high-k dielectric layer may include a high-k dielectric material such as $HfO_2$, $ZrO_2$, HfZrOx, HfSiOx, HfSiON, ZrSiOx, HfZrSiOx, $Al_2O_3$, HfAlOx, HfAlN, ZrAlOx, $La_2O_3$, $TiO_2$, $Yb_2O_3$, silicon nitride, or the like. The dielectric constant (k-value) of the high-k dielectric material is higher than 3.9, and may be higher than about 7.0. The high-k dielectric layer is formed as a conformal layer, and extends on the sidewalls of protruding fins 24' and the sidewalls of gate spacers 38. In accordance with some embodiments of the present disclosure, the high-k dielectric layer is formed using ALD or CVD.

Referring back to FIGS. 7A and 7B, gate electrodes 56 are formed on the top of gate dielectric layers 52, and fill the remaining portions of the trenches left by the removed dummy gate stacks. The sub-layers in gate electrodes 56 are not shown separately in FIG. 7A, while in reality, the sub-layers are distinguishable from each other due to the difference in their compositions. The deposition of at least lower sub-layers may be performed using conformal deposition methods such as ALD or CVD, so that the thickness of the vertical portions and the thickness of the horizontal portions of gate electrodes 56 (and each of sub-layers) are substantially equal to each other.

Gate electrodes 56 may include a plurality of layers including, and not limited to, a Titanium Silicon Nitride (TSN) layer, a tantalum nitride (TaN) layer, a titanium nitride (TiN) layer, a titanium aluminum (TiAl) layer, an additional TiN and/or TaN layer, and a filling metal. Some of these layers define the work function of the respective FinFET. Furthermore, the metal layers of a p-type FinFET and the metal layers of an n-type FinFET may be different from each other, so that the work functions of the metal layers are suitable for the respective p-type or n-type Fin-FETs. The filling metal may include aluminum, tungsten, or cobalt.

Figure 8A:
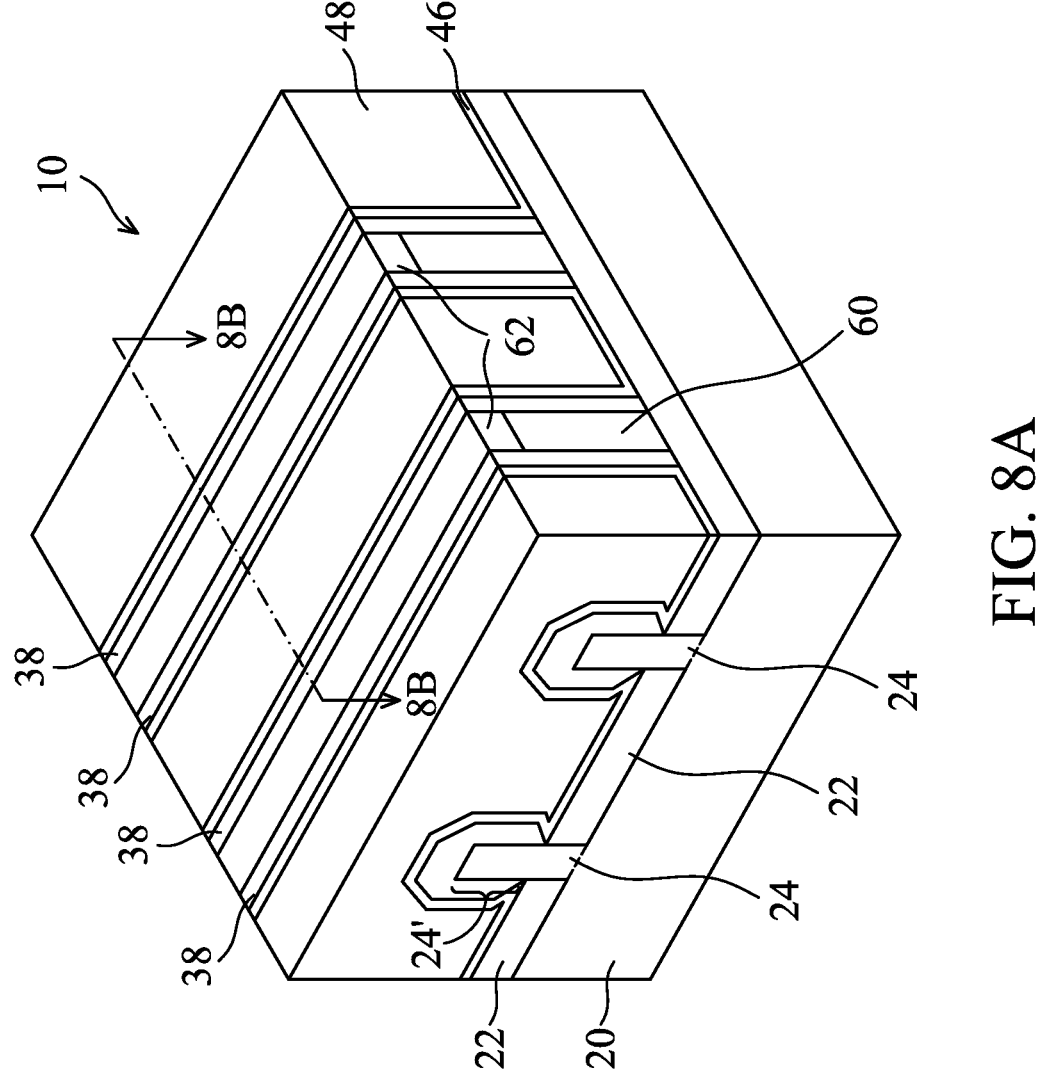
Figure 8B:
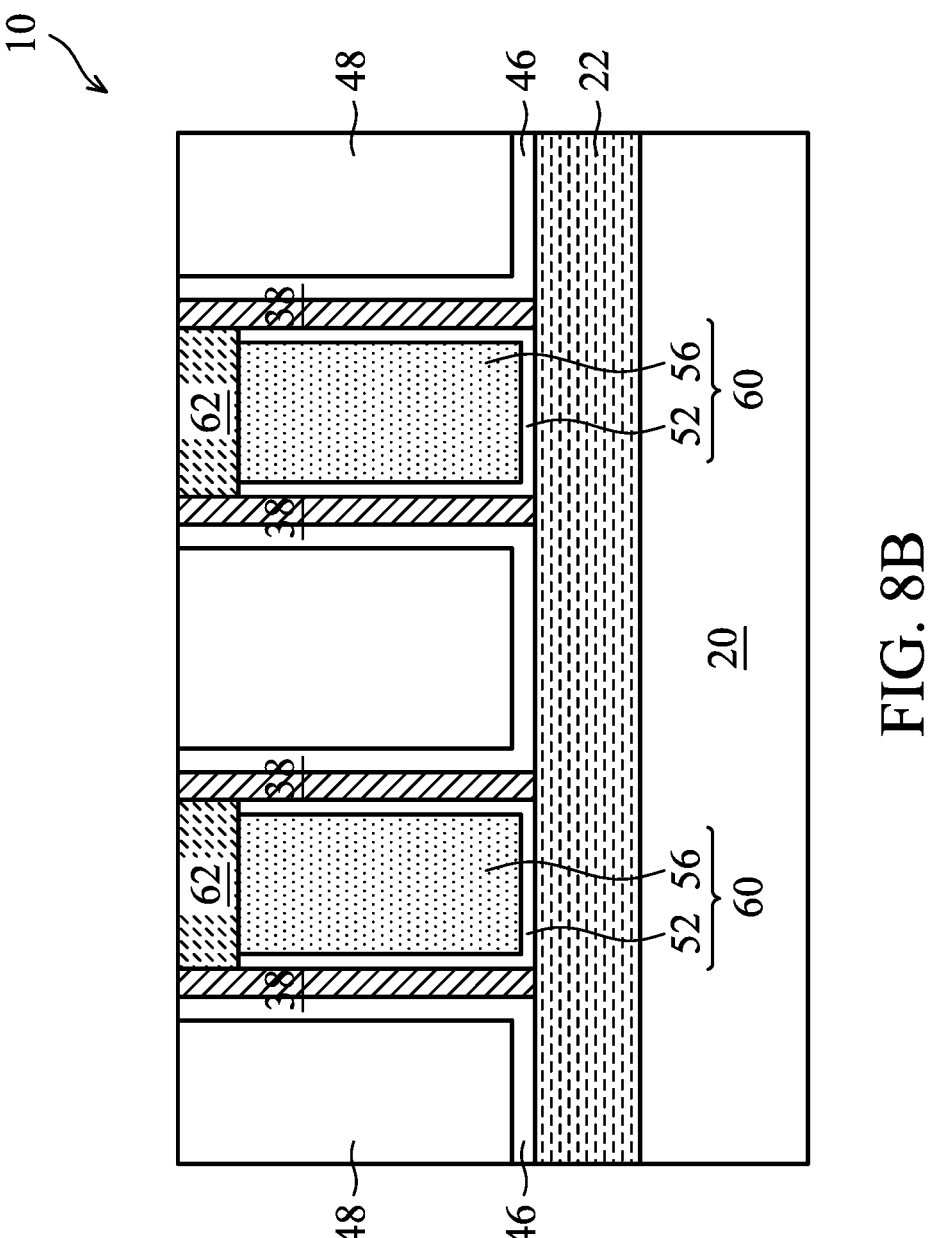

Next, as shown in FIGS. 8A and 8B, hard masks 62 are formed. The material of hard masks 62 may be the same as or different from the materials of some of CESL 46, ILD 48, and/or gate spacers 38. In accordance with some embodiments, hard masks 62 are formed of silicon nitride, silicon oxynitride, silicon oxy-carbide, silicon oxy carbo-nitride, or the like. The formation of hard masks 62 may include recessing replacement gate stacks 60 through etching to form recesses, filling a dielectric material into the recesses, and performing a planarization to remove the excess portions of the dielectric material. The remaining portions of the dielectric material are hard masks 62. FIG. 8B illustrates a cross-sectional view of the structure shown in FIG. 8A, with the cross-sectional view obtained from the plane containing line 8B-8B in FIG. 8A.

FIGS. 9, 10A, 10B, 10C, 11A, 11B, 11C, 12A, 12B, 12C, 13-18, 19A, 19B, 19C, 20A, 20B, and 20C illustrate a cut-metal gate process. The figure numbers of the subsequent processes may include the letter "A," "B," or "C." Unless specified otherwise, the figures whose numbers having the letter "A" are obtained from the vertical plane same as the vertical plane containing line A-A in FIG. 9. The figures whose numbers having the letter "B" are obtained from the vertical plane same as the vertical plane containing line B-B in FIG. 9. The figures whose numbers having the letter "C" are obtained from the vertical plane same as the vertical plane containing line C-C in FIG. 9.

Figure 9:
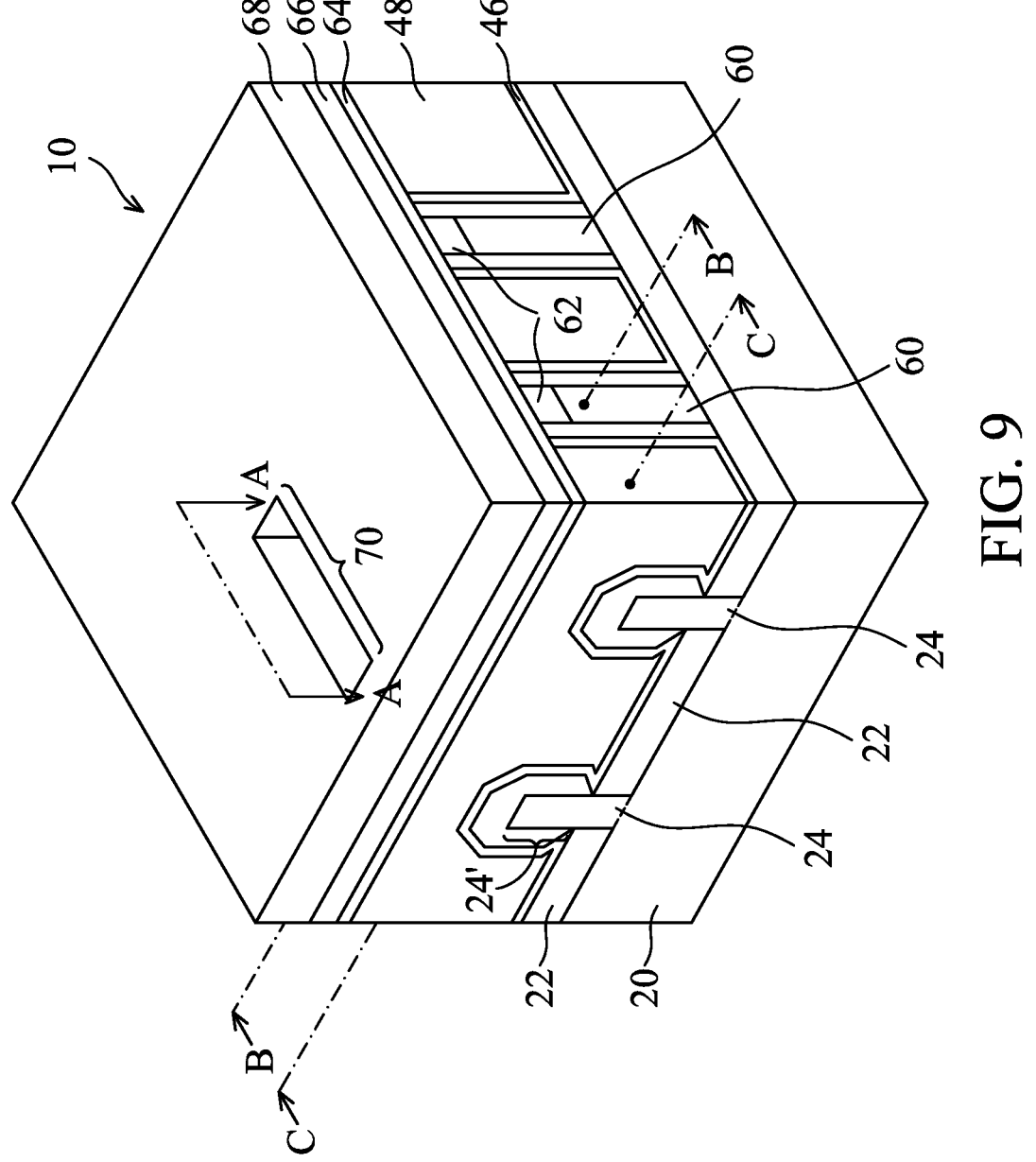
Figure 10A:
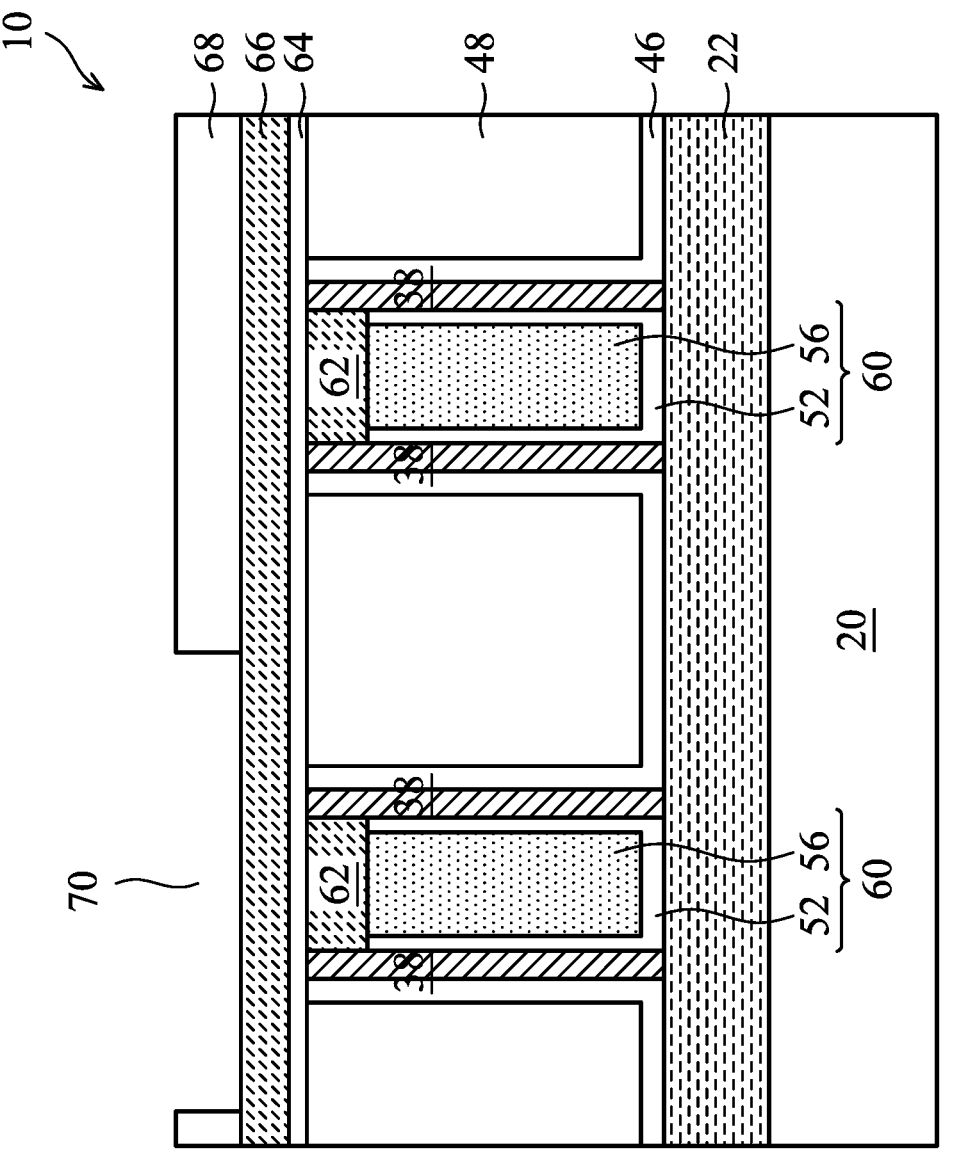
Figure 10B:
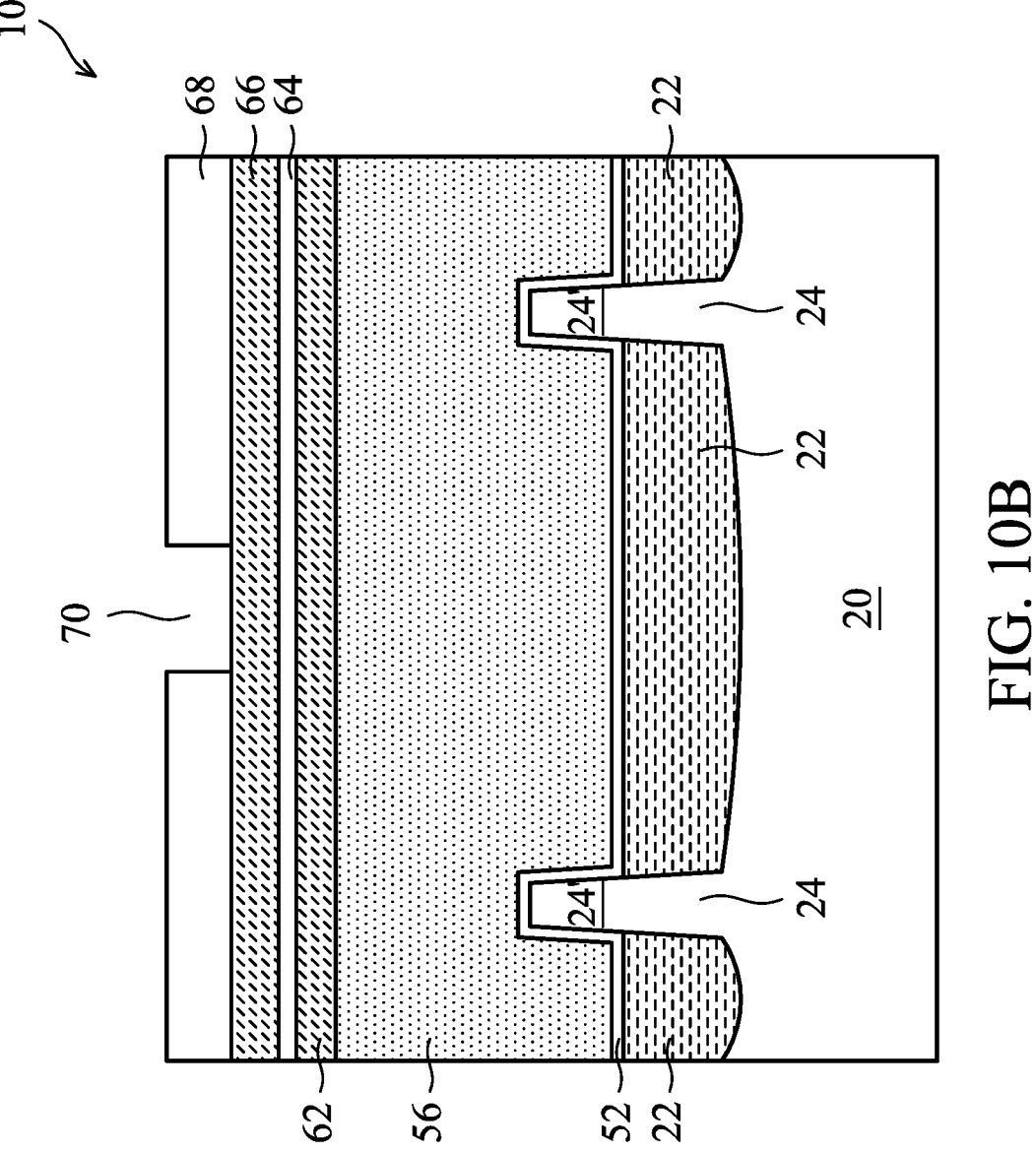
Figure 10C:
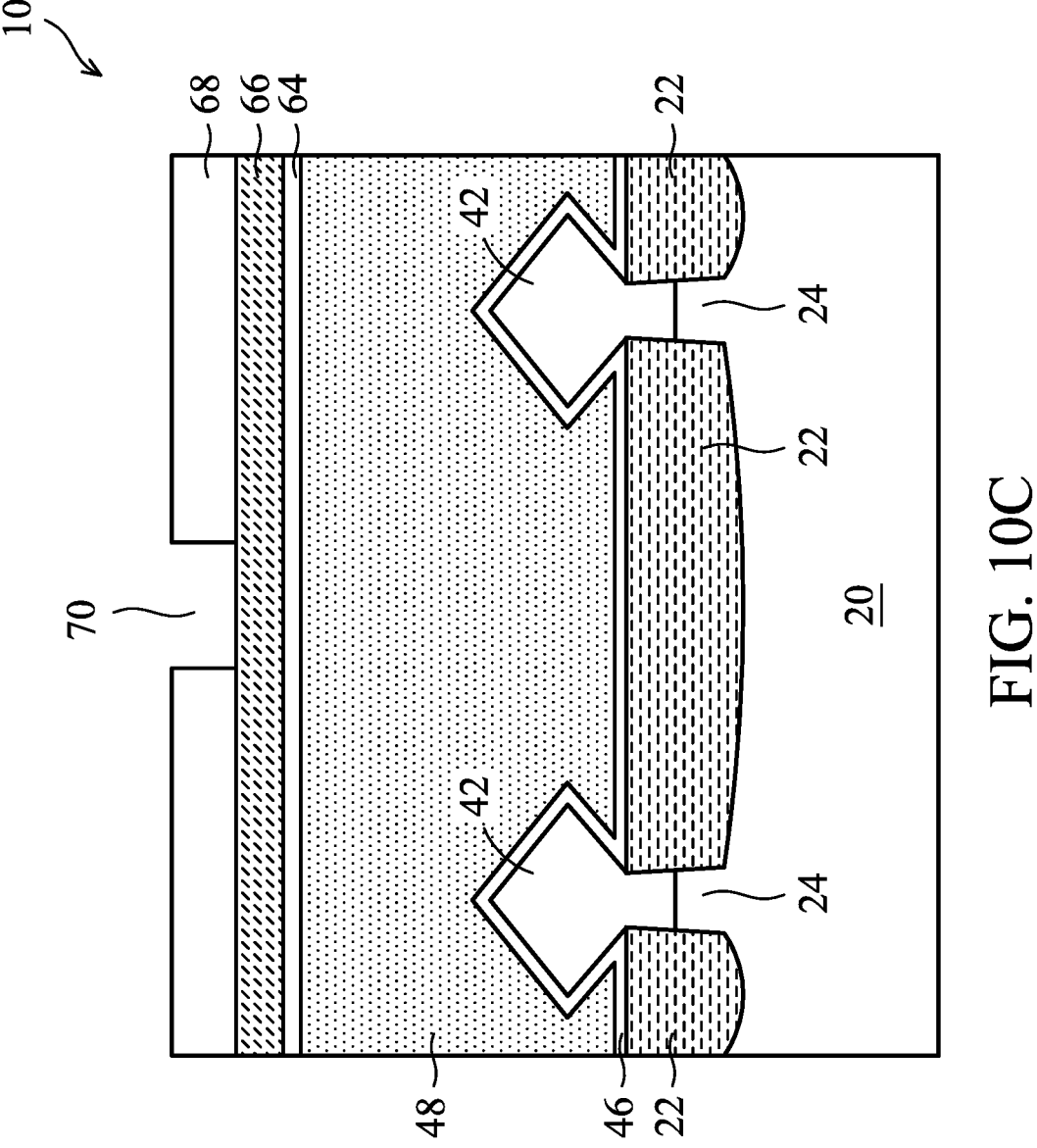

FIGS. 9, 10A, 10B, and 10C illustrate the formation of pad layer 64, hard mask layer 66, and patterned photo resist 68. A Bottom Anti-Reflective Coating (BARC, not shown) may also be formed between hard mask layer 66 and the patterned photo resist 68. FIGS. 10A, 10B, and 10C illustrate the cross-sectional views obtained from the vertical planes containing line A-A, B-B, and C-C, respectively, in FIG. 9. In accordance with some embodiments, pad layer 64 is formed of a metal-containing material such as TiN, TaN, or the like. Pad layer 64 may also be formed of a dielectric material such as silicon oxide. Hard mask layer 66 may be formed of SiN, SiON, SiCN, SiOCN, or the like. The formation may include ALD, PECVD, or the like. Photo resist 68 is coated over hard mask layer 66, and opening 70 is formed in photo resist 68. Opening 70 has a lengthwise direction (viewed from top) perpendicular to the lengthwise direction of the replacement gate 60, and a portion of replacement gate 60 is directly underlying a portion of opening 70, as illustrated in FIGS. 9, 10A, and 10B. Opening 70 may also extend to some portions of ILD 48, as shown in FIGS. 10A and 10C.

Figure 11A:
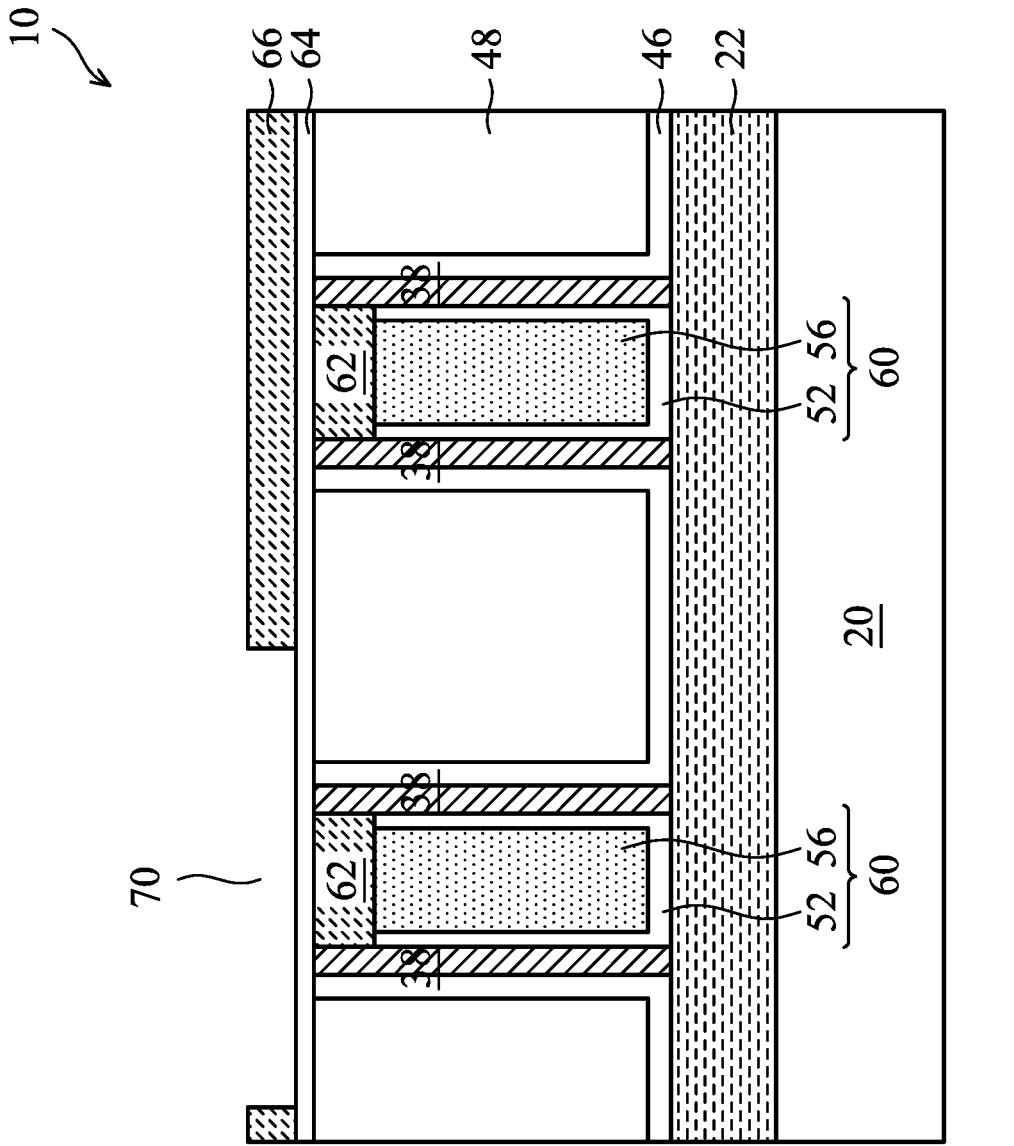
Figure 11B:
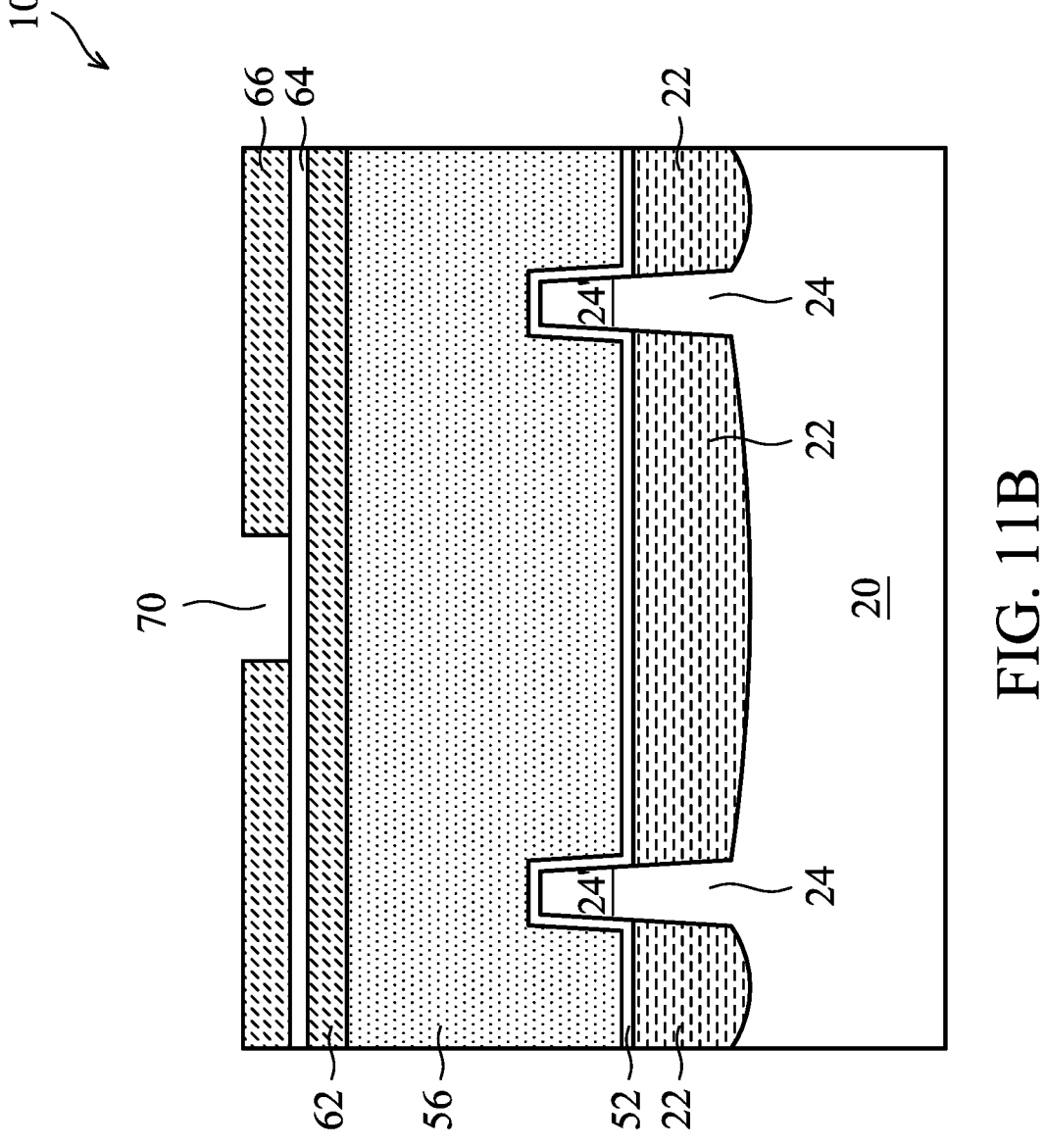
Figure 11C:
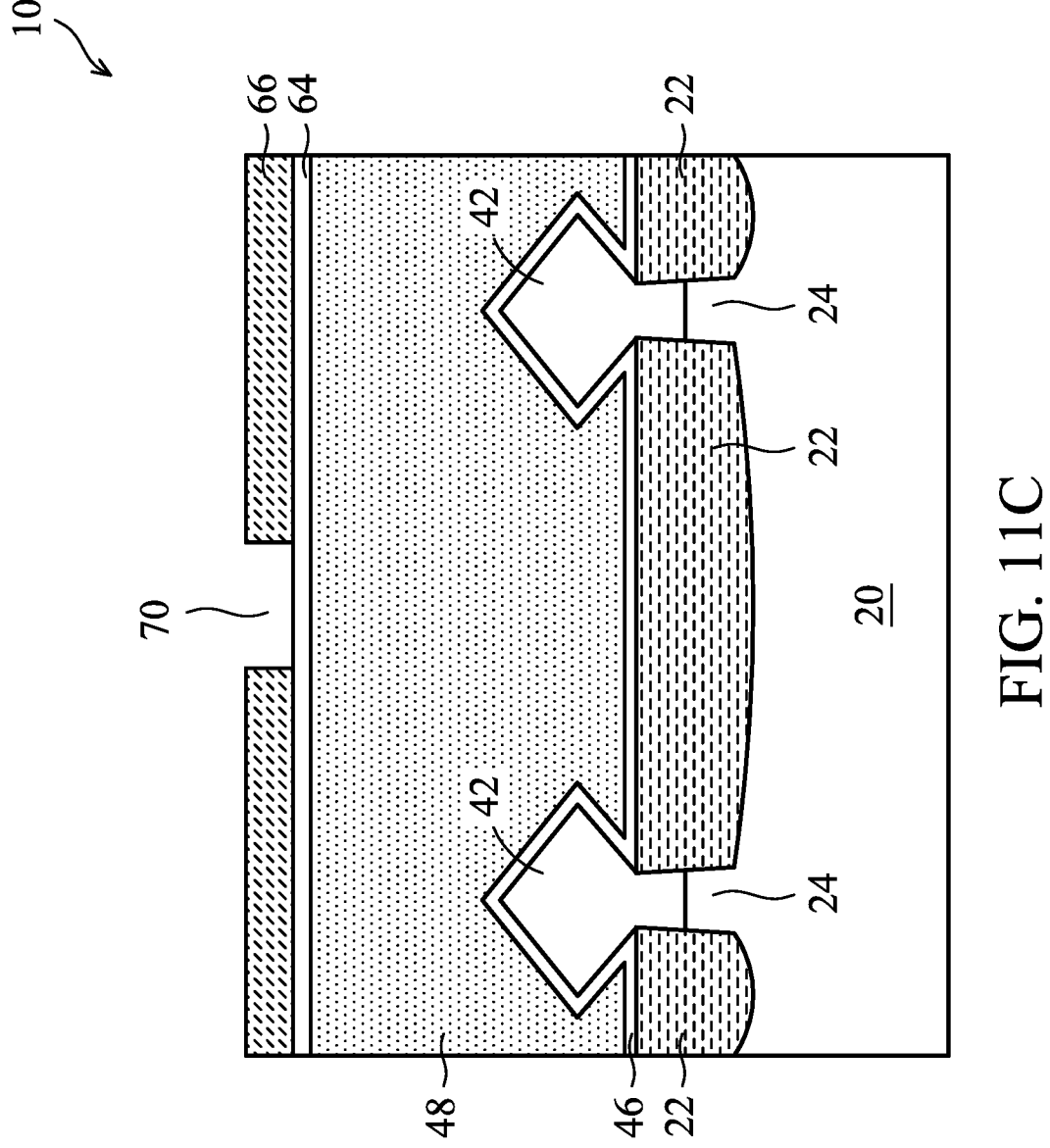

FIGS. 11A, 11B, and 11C illustrate the etching of hard mask layer 66, in which the patterned photo resist 68 (FIGS. 10A, 10B, and 10C) is used as an etching mask. Opening 70 thus extends into hard mask layer 66. The respective process is illustrated as process 212 in the process flow 200 as shown in FIG. 25. The top surface of pad layer 64 is thus exposed to opening 70. Photo resist 68 is then removed.

Figure 12A:
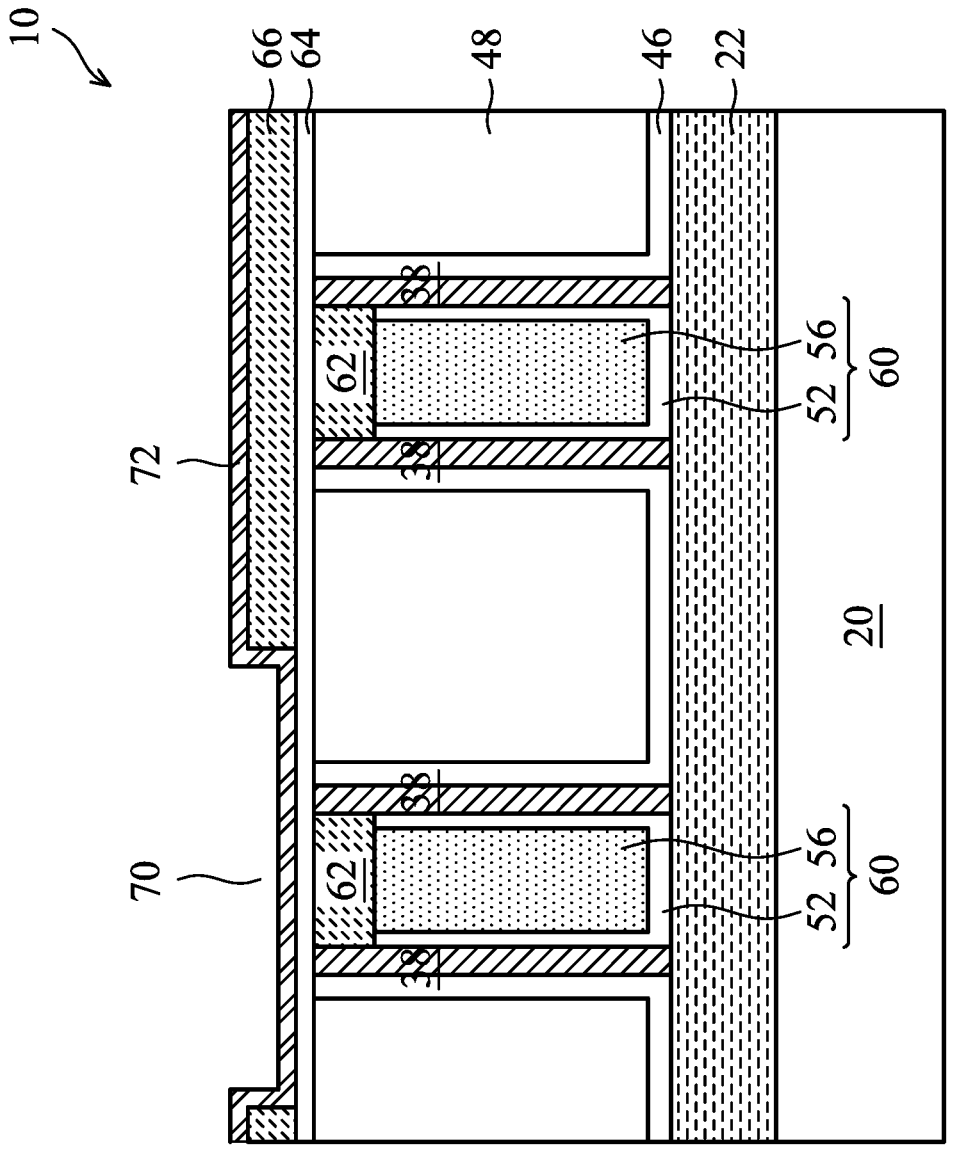
Figure 12B:
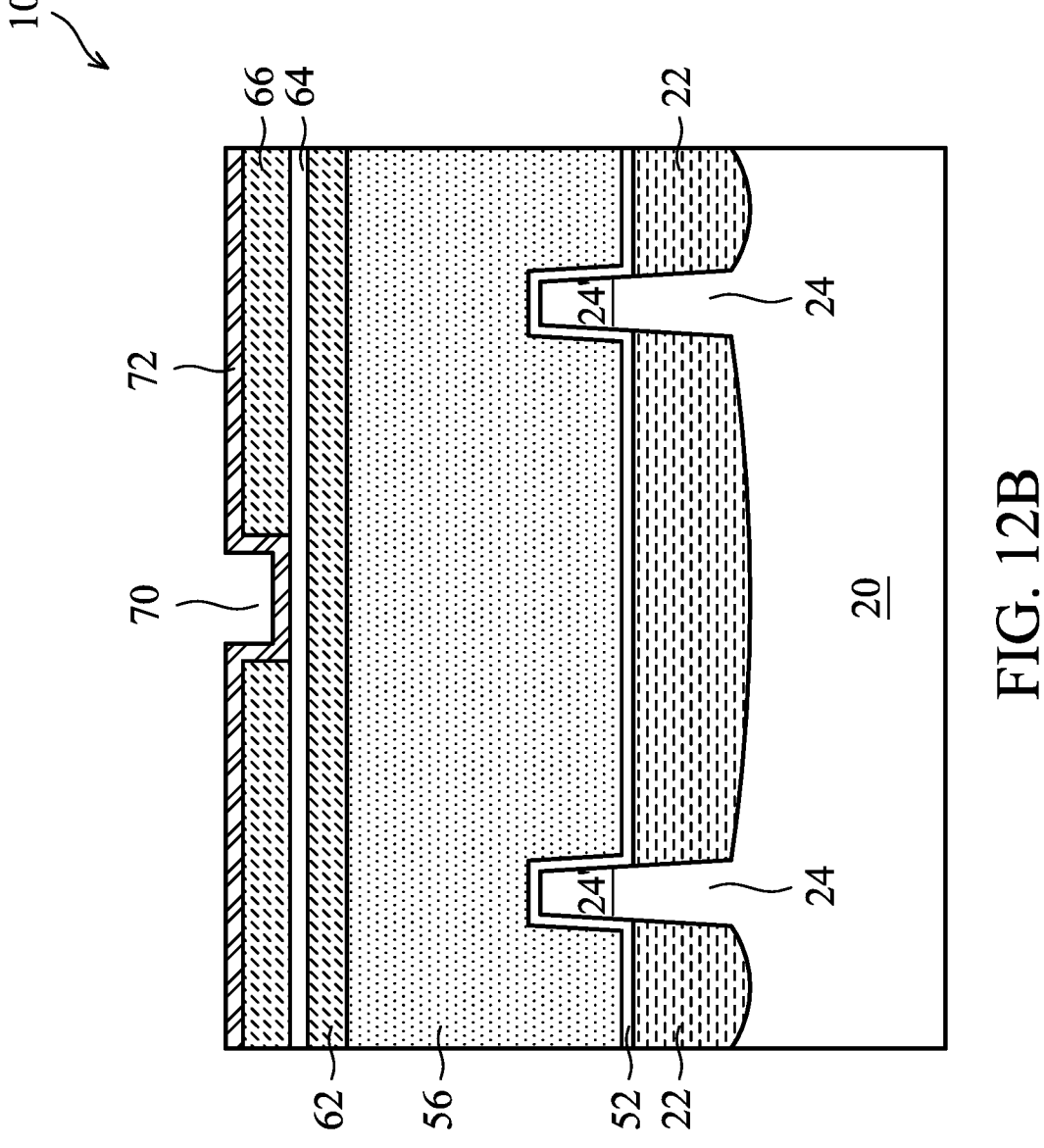
Figure 12C:
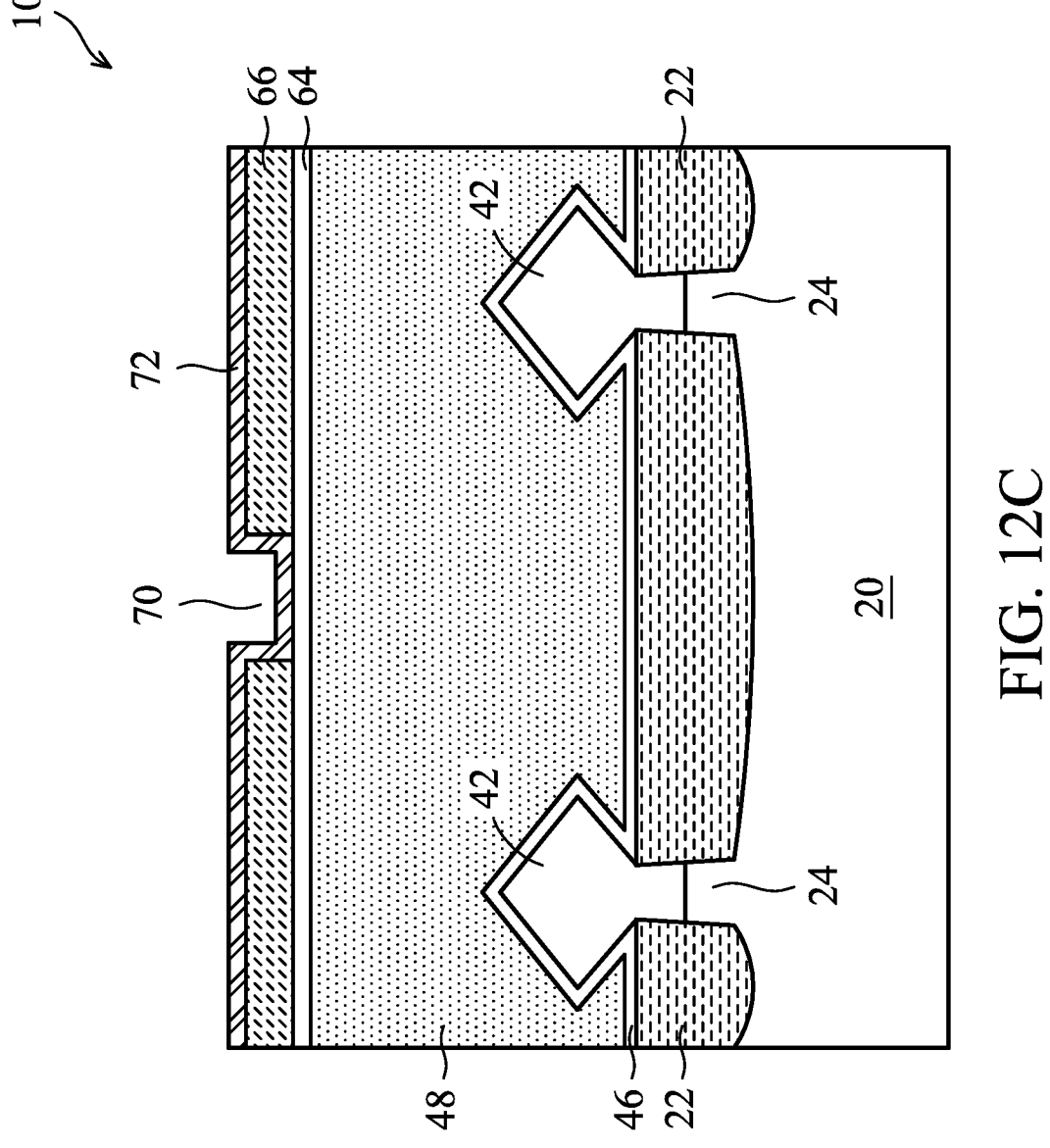
Figure 13:
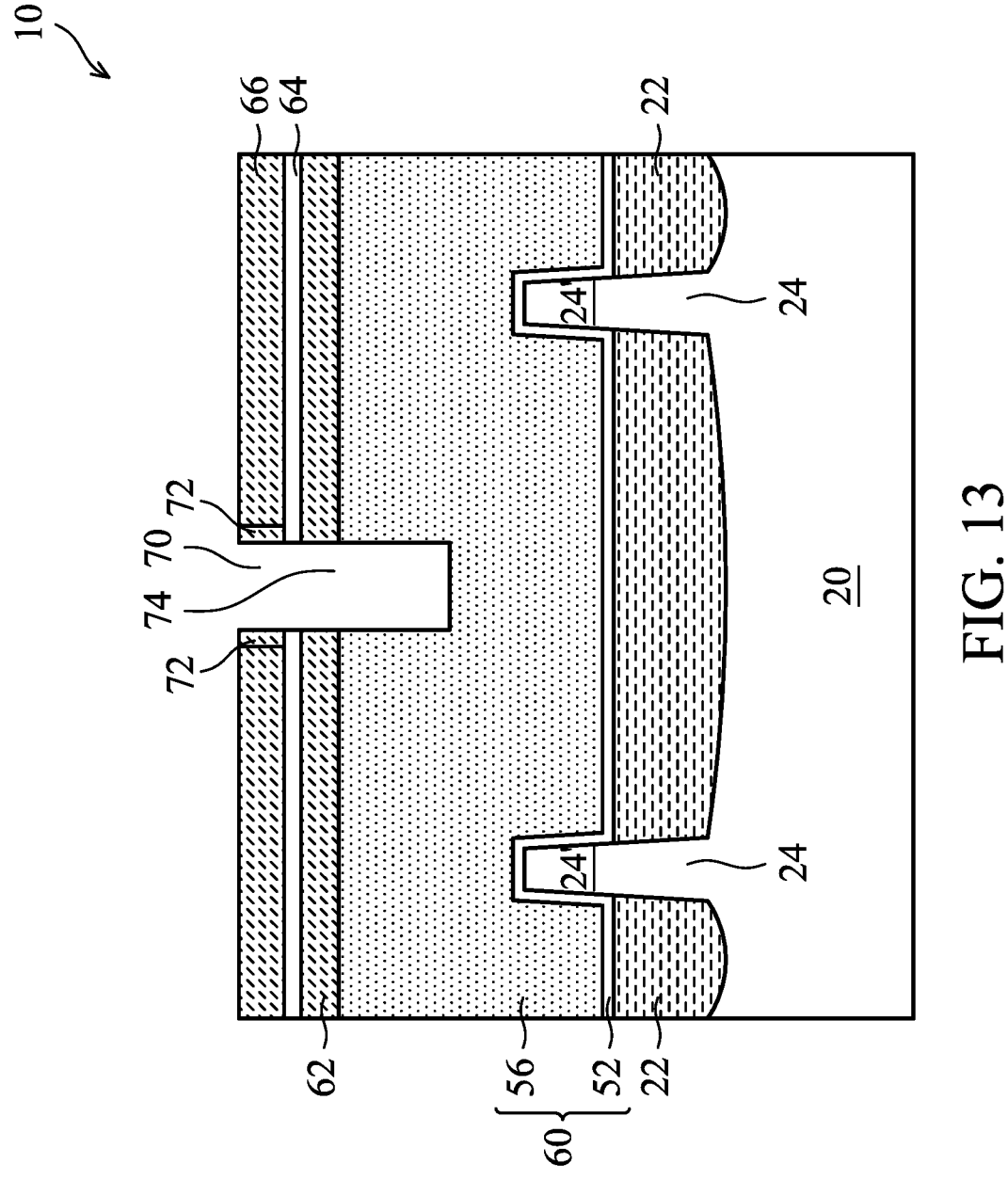

FIGS. 12A, 12B, and 12C illustrate the formation of hard mask layer 72 in accordance with some embodiments, which narrows opening 70. The respective process is illustrated as process 214 in the process 200 as shown in FIG. 25. In accordance with some embodiments of the present disclosure, hard mask layer 72 is formed of a same material as that of hard mask layer 66, which may be SiN, for example. Hard mask layer 72 may also be formed of a different material than that of hard mask layer 66. Hard mask layer 72 is formed conformally, using, for example, ALD or CVD, so the thicknesses of the horizontal portions of and vertical portions of hard mask layer 72 are substantially equal to each other, for example, with a difference smaller than about 10 percent of the thickness of the horizontal portions. Hard mask layer 72 is formed to reduce the horizontal width of openings 70, so that the width of the subsequently formed isolation region is reduced. In accordance with alternative embodiments of the present disclosure, the formation of hard mask layer 72 is skipped.

FIGS. 13 through 18 illustrate the removal of the bottom portion of hard mask layer 72 in opening 70, and the formation of trench 74. The cross-sectional views of FIGS. 13 through 18 are obtained from the reference cross-section B-B in FIG. 9. The bottom portion of hard mask layer 72 may be removed in an anisotropic etching process, until pad layer 64 is exposed. The vertical portions of hard mask layer 72 remains in opening 70, and the width of opening 70 is reduced by the remaining portions of hard mask layer 72. Next, pad layer 64 and the underlying hard mask 62 and gate electrode 56 are etched to form trench 74, which extends to an intermediate level of gate electrode 56. The respective process is illustrated as process 216 in the process flow 200 as shown in FIG. 25. Gate spacers 38 and the exposed portions of ILD 48 (not shown in FIG. 13, visible in FIG. 21) are also etched.

In accordance with some embodiments of the present disclosure, the etching is performed using process gases selected from, and not limited to, $Cl_2$, $BCl_3$, Ar, $CH_4$, $CF_4$, and combinations thereof. The etching of gate electrode 56 may be performed with a pressure in the range between about 2.5 mTorr and about 25 mTorr. An RF power is applied in the main etching, and the RF power may be in the range between about 250 Watts and about 2,500 Watts. A bias voltage in the range between about 25 volts and about 750 volts may also be applied. The etching may be stopped when the bottom surface of trench 74 is at an intermediate level between a top surface and a bottom surface of gate electrode 56.

Figure 14:
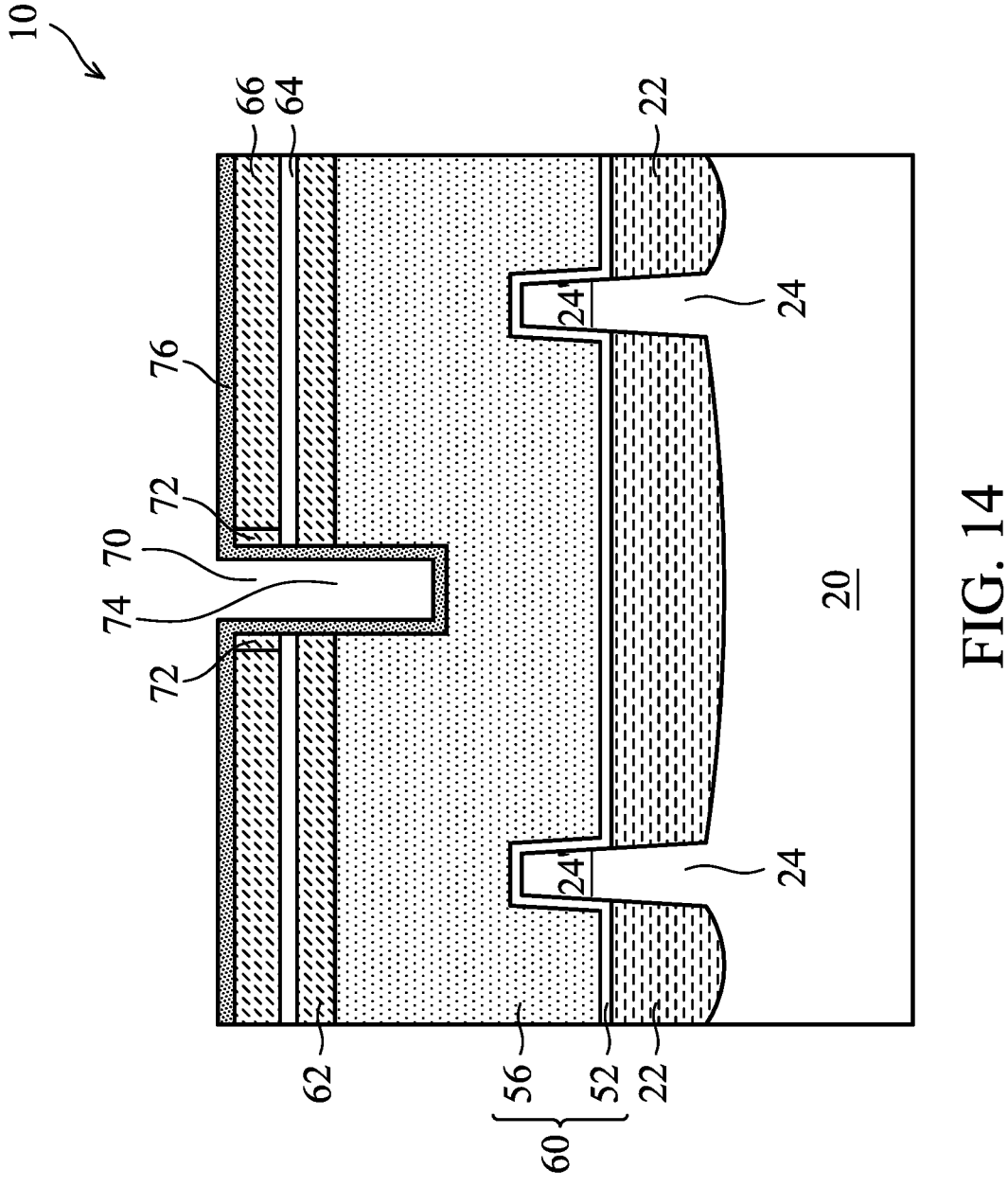
Figure 15:
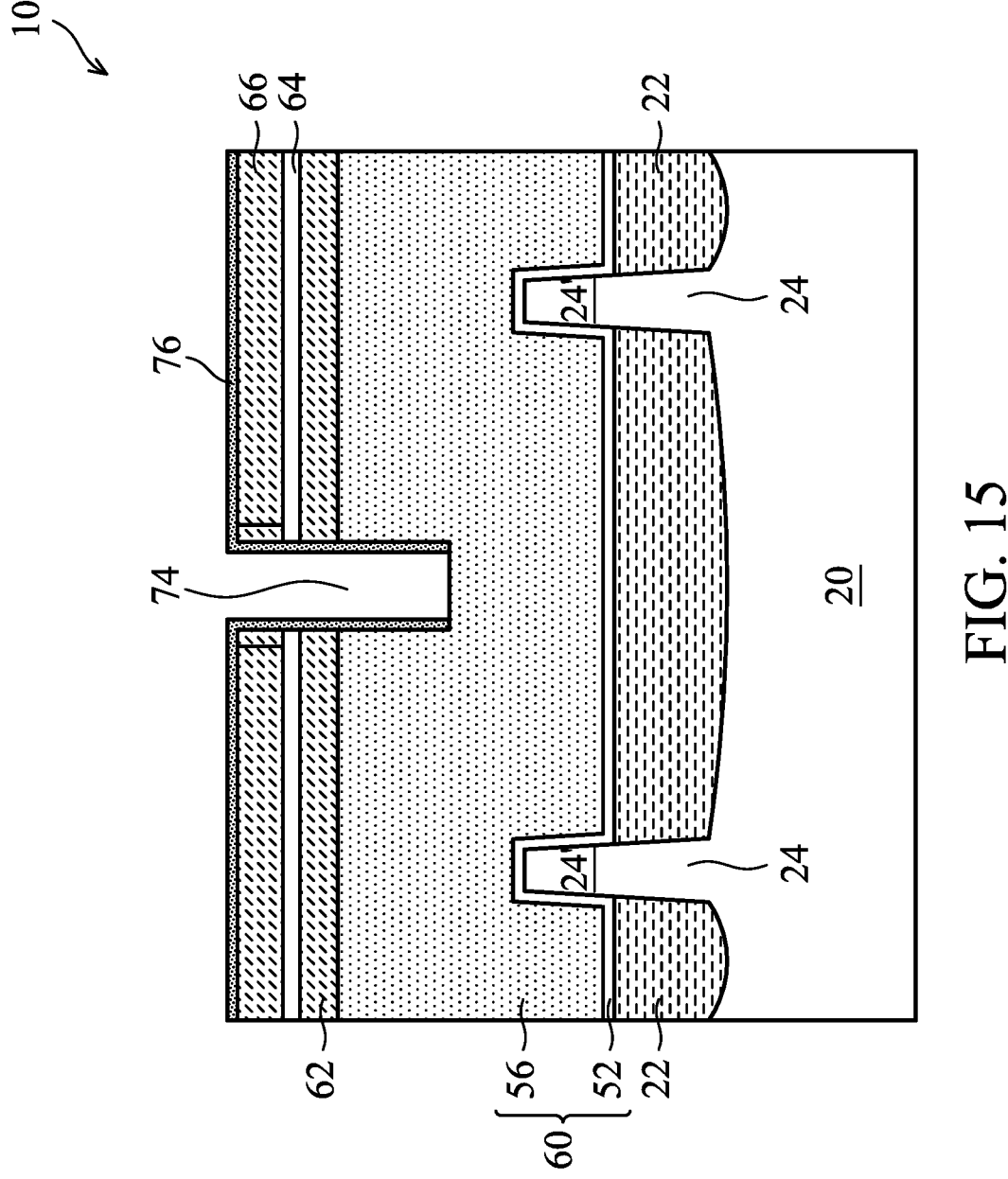
Figure 16:
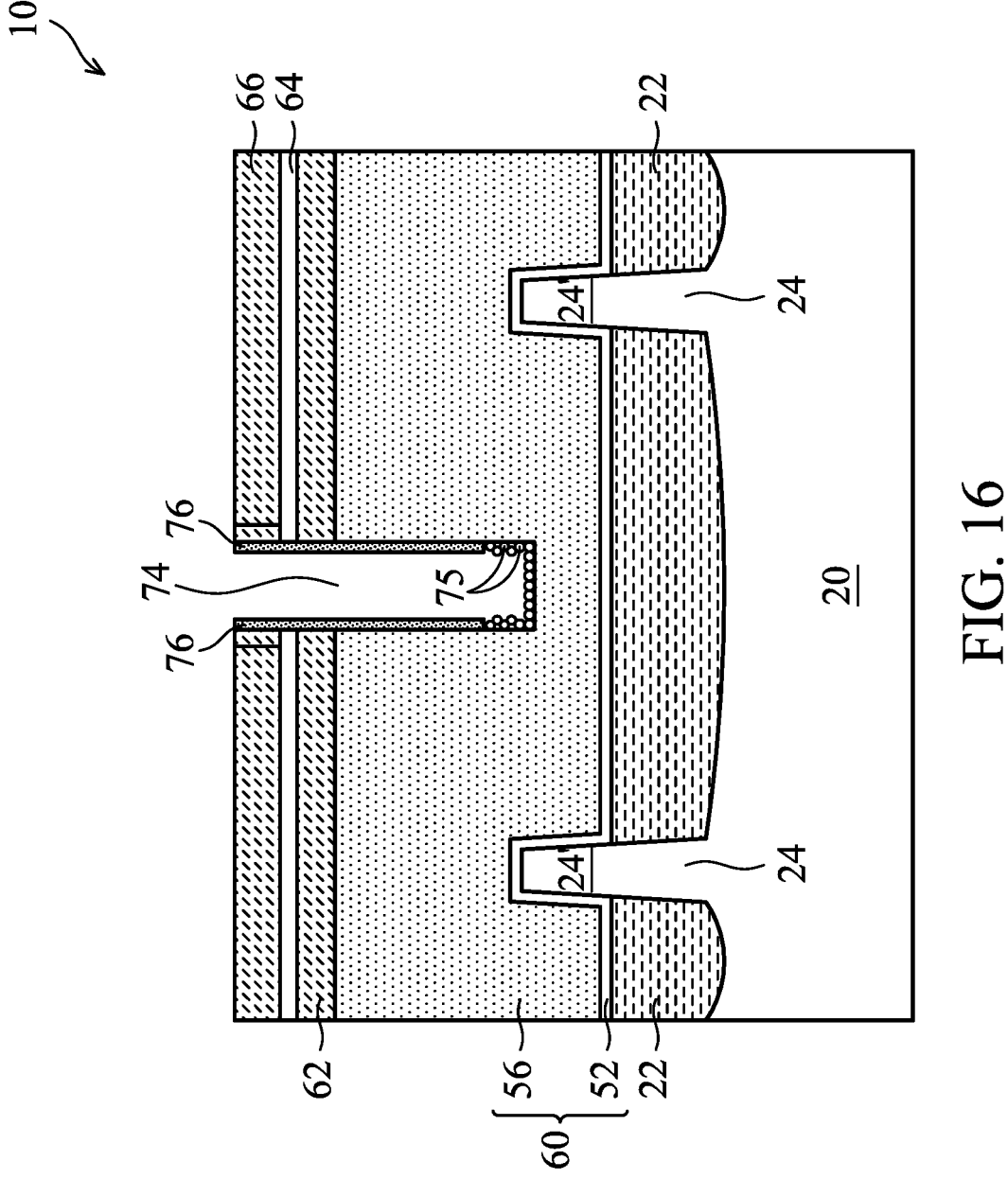

FIGS. 14 through 16 illustrate a deposition-etching cycle. Referring to FIG. 14, a deposition process is performed, which results in the deposition of dielectric layer 76. The respective process is illustrated as process 218 in the process flow 200 as shown in FIG. 25. Dielectric layer 76 includes sidewall portions on the sidewalls of trench 74 to protect the sidewalls, so that the upper portions of trench 74 are not laterally expanded when the trench 74 is extended downwardly. In accordance with some embodiments of the present disclosure, the deposition of dielectric layer 76 is performed using process gases including $SiCl_4$, $O_2$, Ar, and the like. The resulting dielectric layer 76 includes $SiO_2$ therein, which may or may not be compounded with additional elements such as carbon.

Next, referring to FIG. 15, a dielectric breaking process is performed, so that the bottom portion of dielectric layer 76 at the bottom of trench 74 is removed in an anisotropic etching/bombardment process. The respective process is illustrated as process 220 in the process flow 200 as shown in FIG. 25. In accordance with some embodiments, a carbon-and-fluorine gas (such as $C_4F_6$) is used to etch the bottom portion of dielectric layer 76. The thickness of the portion of dielectric layer 76 on the top surface of hard mask layer 66 may be reduced during the etching process. The thickness of the portions of dielectric layer 76 on the sidewalls of trench 74 may also be reduced during the etching process.

Referring to FIG. 16, another etching process is performed to extend trench 74 deeper into gate electrode 56. The respective process is illustrated as process 222 in the process flow 200 as shown in FIG. 25. The etching is performed using an appropriate etching gas, depending on the material of the etched portion of gate electrode 56. In accordance with some embodiments, a polymer such as $C_xH_y$ may be formed (with X and Y being integers) at the bottom of opening. The polymer is schematically illustrated as 75. The polymer may then be removed, for example, using oxygen ($O_2$).

Figure 17:
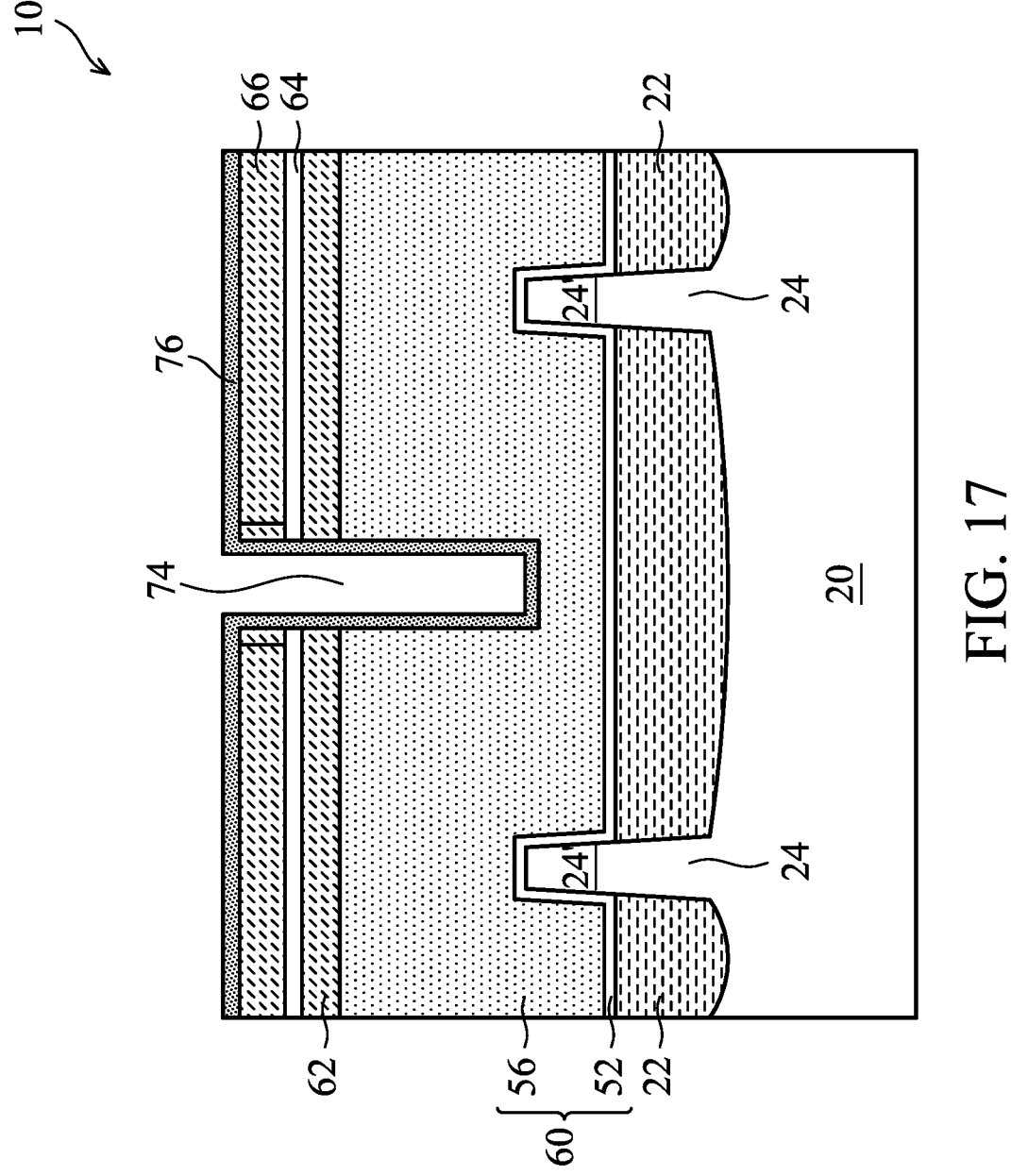
Figure 18:
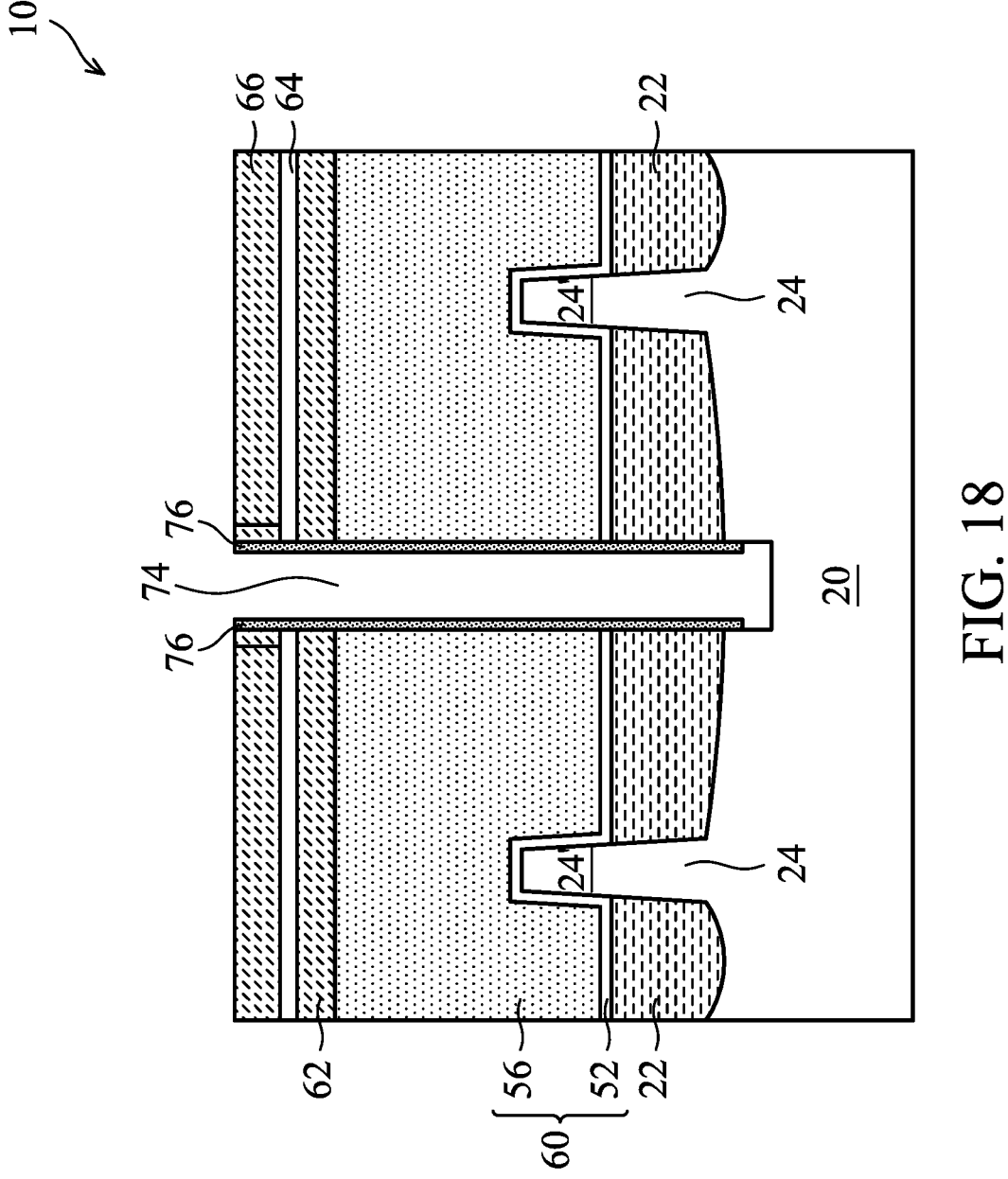

In accordance with some embodiments, the etching of gate electrode 56 includes a plurality of deposition-etching cycles, each including a dielectric-deposition process, a dielectric breaking process, an etching process to extend trench 74 down, and possibly a polymer removal process. The plurality of deposition-etching cycles is shown in the process flow 200 in FIG. 25 by the loopback process. For example, FIG. 17 illustrates that an additional deposition process is performed to further form dielectric layer 76. The illustrated dielectric layer 76 also includes a portion of the dielectric layer formed in previous deposition processes. In a subsequent process, dielectric layer 76 is etched in a dielectric breaking process, and the gate electrode 56 is further etched. Each of the deposition-etching cycles results in trench 74 to extend further down, until gate electrode 56 and gate dielectric 52 are etched through, and trench 74 extends into STI region 22. The resulting structure is shown in FIG. 18. Trench 74 may stop in STI region 22, or may further extend into the bulk portion of substrate 20 directly under STI region 22. After the last etching process, no more dielectric layer is deposited, and hence in FIG. 18, the bottom ends of dielectric layer 76 are higher than the bottom of trench 74. The polymer layer, if any in trench 74, is removed.

Figure 19A:
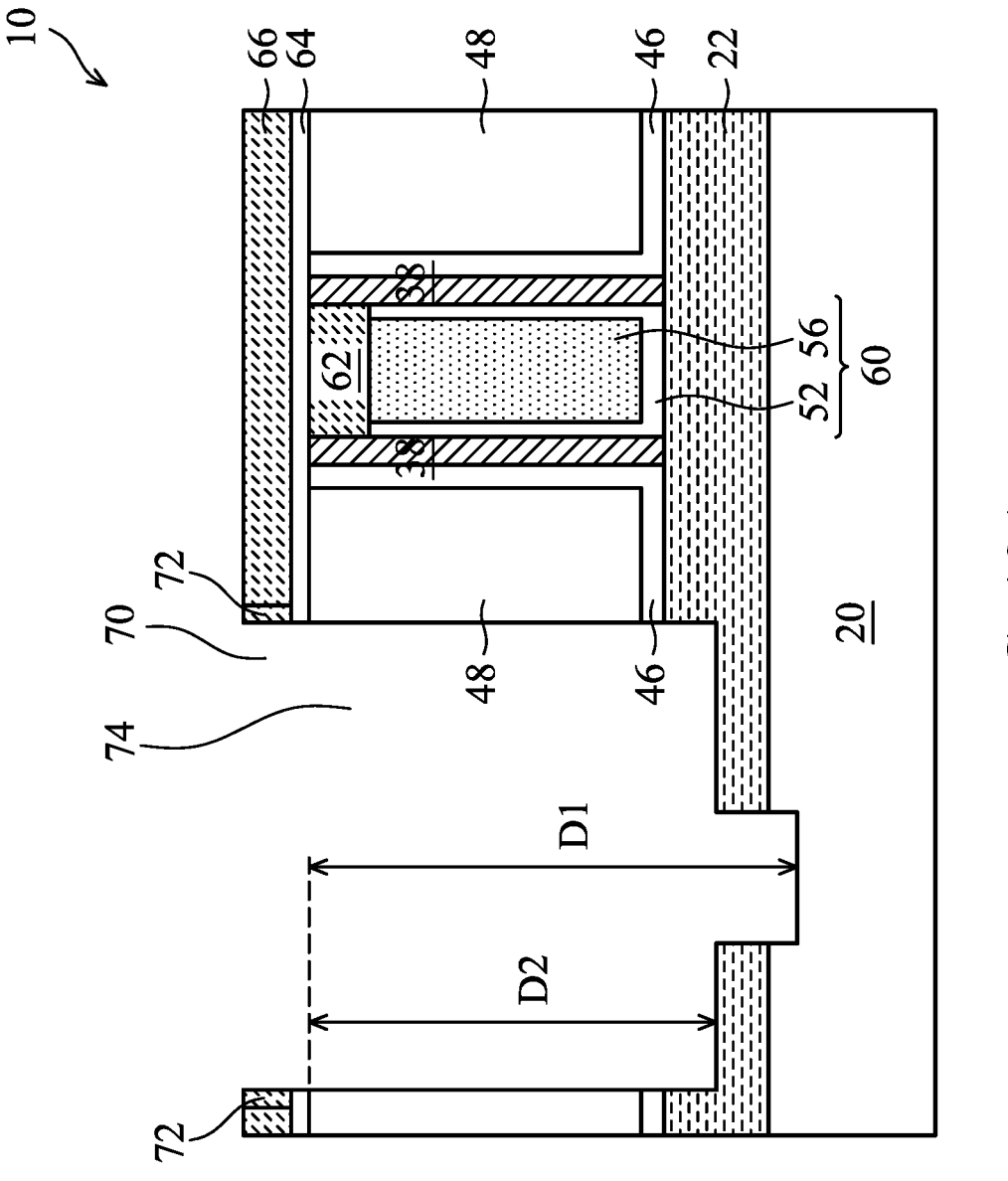
Figure 19B:
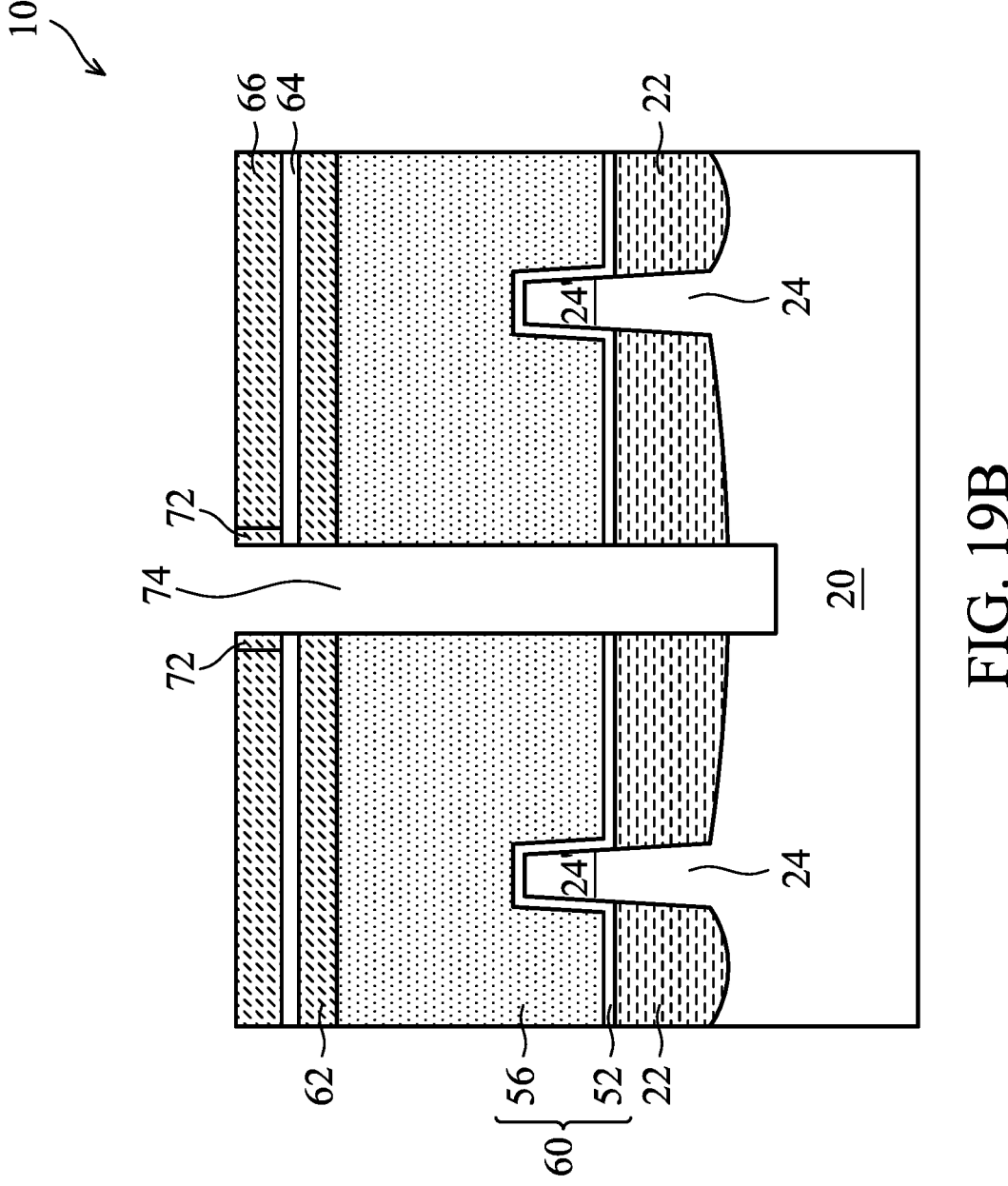

In a subsequent process, dielectric layer 76 is removed, and the resulting structure is shown in FIG. 19B. The respective process is illustrated as process 224 in the process flow 200 as shown in FIG. 25. In accordance with some embodiments, dielectric layer 76 comprises silicon oxide, and the removal of dielectric layer 76 is performed using HF and ammonia ($NH_3$) gases. Dilute gases such as Ar, He, $N_2$, or the like or combinations thereof may be added. Dielectric layer 76 reacts with HF and ammonia to form a solid layer, which reaction may be achieved in a first process chamber. The wafer including the solid layer is then transferred to a second process chamber, in which wafer 10 is baked, so that the solid layer is sublimated into gases and evacuated. The reaction equation may be as follows:

$$SiO_{2(s)} + 4HF_{(g)} + 4NH_{3(g)} \rightarrow SiF_{(g)} + 2H_{2(g)}O_{(g)} + 4NH_3 \qquad [Eq.\ 1]$$

$$SiF_{4(g)} + 2HF_{(g)} + 2NH_{3(g)} \rightarrow (NH_4)_2SiF_{6(s)} \qquad [Eq.\ 2]$$

$$(NH_4)_2SiF_{6(s)} \rightarrow SiF_{4(g)} + 2HF_{(g)} + 2NH_{3(g)} \qquad [Eq.\ 3].$$

In above reaction equations, the letter "s" means solid, and the letter "g" means gas. Reaction equation 1 and reaction equation 2 are the reactions occurring in the first process chamber, and Equation 3 occurs in the second process chamber, in which wafer 10 is heated to a temperature higher than about 100 degrees to sublimate $(NH_4)_2SiF_{6(s)}$. The formed $(NH_4)_2SiF_{6(s)}$ is thicker than dielectric layer 76. For example, for every 1 nm dielectric layer 76 that is reacted, a 3.5 nm $(NH_4)_2SiF_{6(s)}$ may be generated.

Experiment results indicated that the threshold voltage of the resulting transistor is affected by dielectric layer 76, and affected by the removal process of dielectric layer 76.

Furthermore, the widths of the resulting trench 74 may be affected by the removal process, which may be resulted due to the removal of the surface portions of gate electrode 56 that are exposed to trench 74. Throughout wafer 10, the portions of dielectric layer 76 in different parts (such as edge part or center part) of wafer 10 may be removed non-uniformly. For example, the reaction gases HF and $NH_3$ may be introduced into the first chamber from the top of wafer 10, and the outlet of the gases may be on the sidewall of the first chamber. This may cause non-uniformity in the effective flow rate of the gases on different parts of wafer 10, and in turn causes the non-uniformity of the removal of dielectric layer 76. For example, the portions of dielectric layer 76 close to the center of wafer 10 may have a lower removal rate than the portions of dielectric layer 76 close to the edge of wafer 10.

Figure 22:
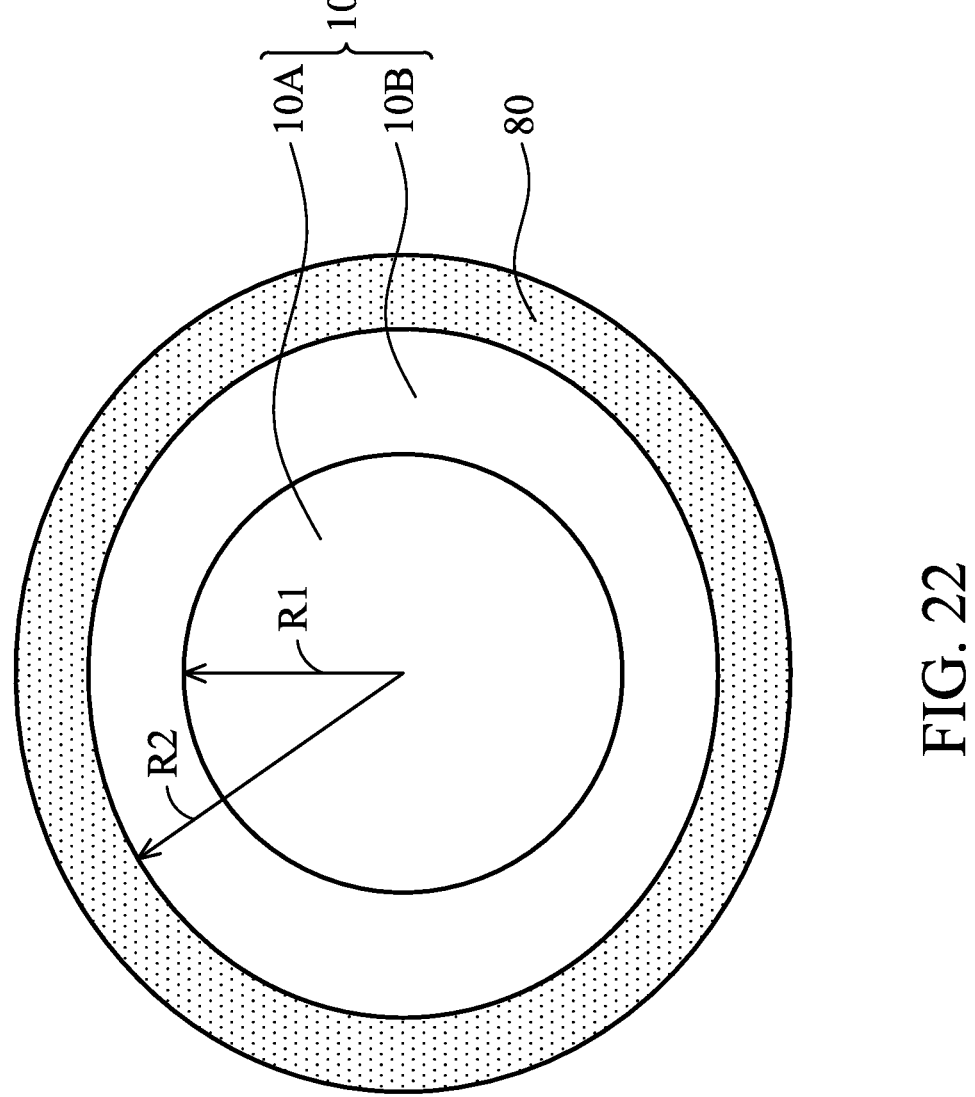
FIG. 22 illustrates the temperature distribution of a wafer in the removal of a dielectric layer generated in a cute-metal-gate process in accordance with some embodiments.

To achieve a more uniform removal of dielectric layer 76, various process conditions may be adjusted. In accordance with some embodiments of the present disclosure, the center portion of wafer 10 may be provided with a lower temperature than the edge portions when dielectric layer 76 reacts with HF and ammonia. For example, FIG. 22 illustrates a top view of an electro-static chuck 80, on which wafer 10 is secured. Wafer 10 may include center region 10A and peripheral region 10B encircling center region 10A. The radius R1 of center region 10A may be in the range between about 50 percent and about 80 percent of radius R2 of wafer 10. During the removal of dielectric layer 76, the center region 10A is kept at a first temperature T1 lower than a second temperature T2 of peripheral region 10B. Since the removal of dielectric layer 76 may be an exothermic reaction, lower temperatures result in higher reaction rates, and hence the removal rate of the portions of dielectric layer 76 in center region 10A is increased to compensate for its otherwise lower reaction rate. The temperature difference (T2–T1) cannot be too high or too low. If the difference is too high such as higher than 15° C., the temperature difference is difficult to maintain since the temperature at the center and the edge portions of the will affect each other. If the temperature is too low, the difference in the reaction rates caused by the temperature difference is not high enough to compensate for the removal rate difference between center region 10A and peripheral region 10B of wafer 10. In accordance with some embodiments, the temperature difference (T2–T1) is smaller than about 15° C., and may be in the range between about 5° C. and about 15° C. The temperature difference may be achieved by adjusting the temperature of the center portion of electro-static chuck 80 to be lower than the temperature of the edge portion of electro-static chuck 80. In the removal of dielectric layer 76, the overall temperature of wafer 10 may be in the range between about 25° C. and about 90° C.

Figure 23:
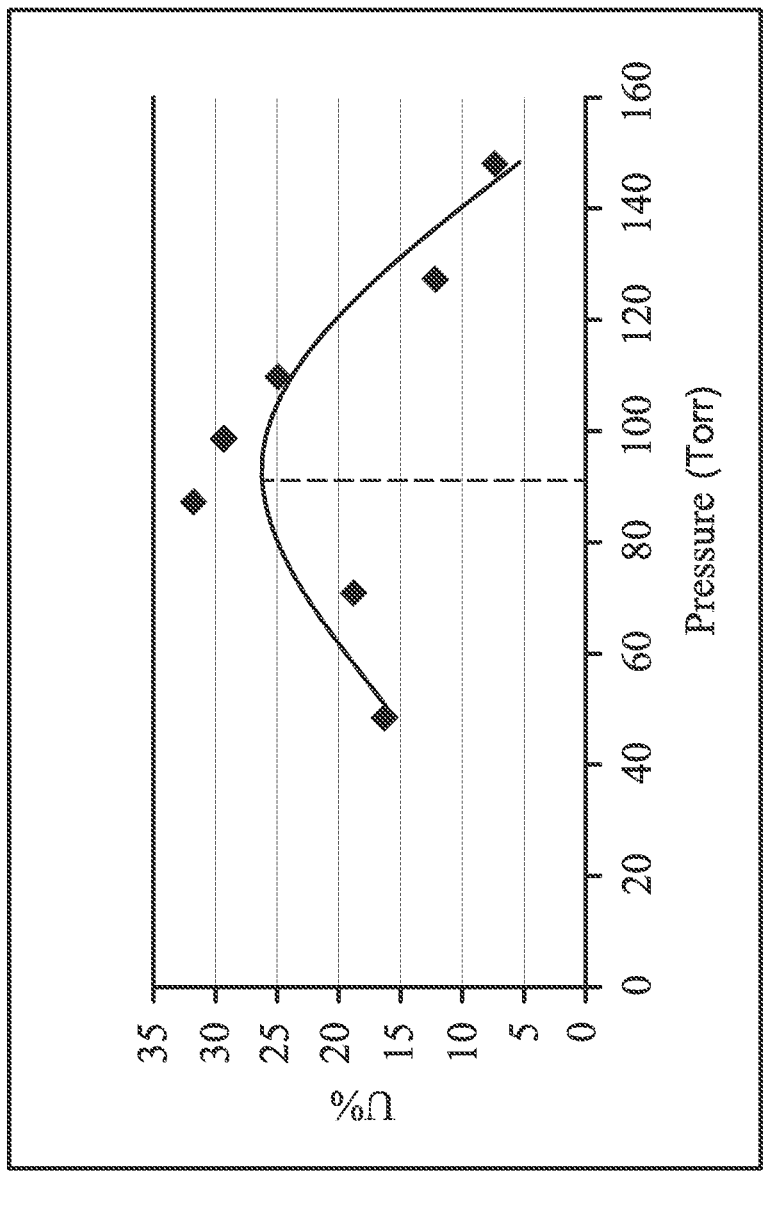
FIG. 23 illustrates the uniformity of the etching amount of a dielectric layer on a wafer as a function of pressure in accordance with some embodiments.

The uniformity of the removal rate of dielectric layer 76 is also related to the pressure of the first process chamber (in which reaction equations 1 and 2 occur) and the flow rate of the dilute gas such as Ar, $N_2$, He, or the like in the first process chamber. For example, FIG. 23 illustrates the uniformity value of the removal rate of dielectric layer 76 in wafer 10 as a function of pressure. FIG. 23 shows that with the increase in the pressure, the uniformity increases (improves) and reaches a highest value at around 85 torrs and about 100 torrs. When the pressure further increases, the uniformity decreases. Accordingly, the desired pressure of wafer 10 may be found through experiments, for example, by removing dielectric layer 76 from a plurality of sample wafers having the same structures using different pressures, so that the desirable pressure may be found. The production wafer may then be formed using the found desirable pressure associated with the highest uniformity.

Figure 24:
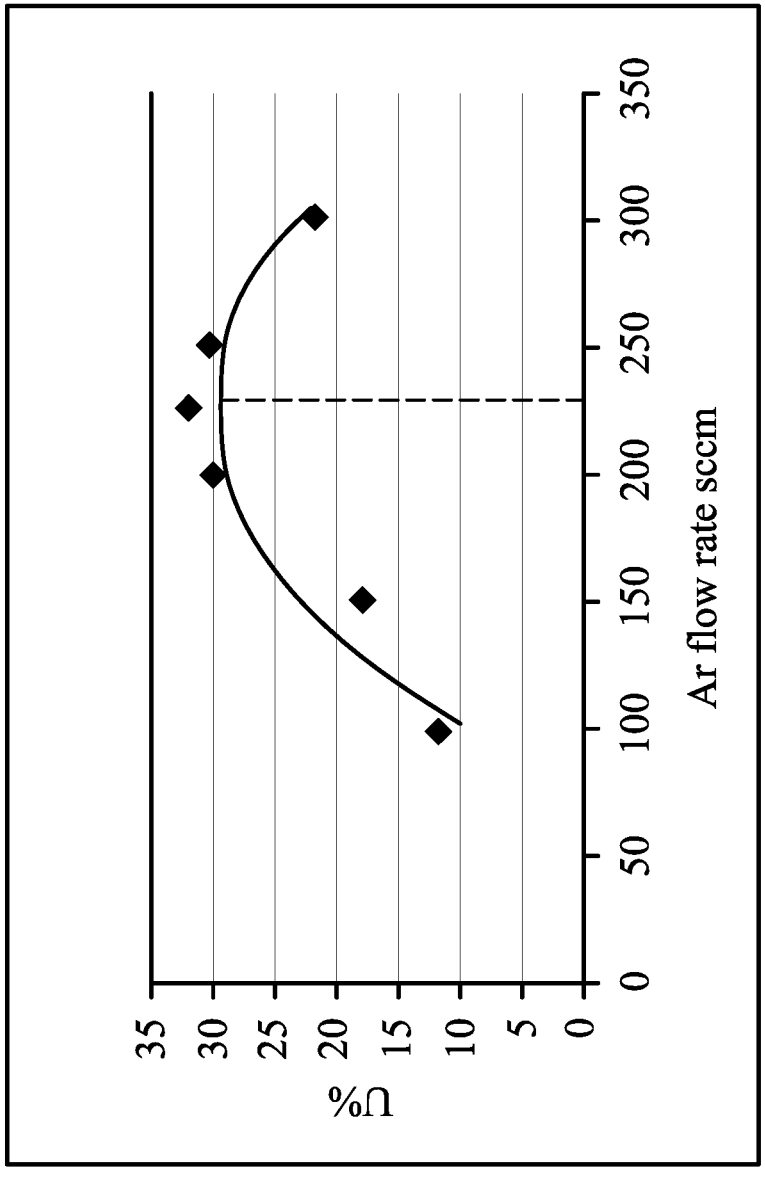
FIG. 24 illustrates the uniformity of the etching amount of a dielectric layer on a wafer as a function of the flow rate of dilute gas in accordance with some embodiments.

The uniformity of the removal rate of dielectric layer 76 is also related to the flow rate of the dilute (carrier) gas such as Ar, $N_2$, He, or the like. For example, FIG. 24 illustrates the uniformity value of the removal rate of dielectric layer 76 in wafer 10 as a function of the flow rate of argon (which is adopted as the dilute gas). FIG. 24 shows that with the increase in the flow rate of argon, the uniformity increases (improves) and reaches a highest value when the carrier gas argon has a flow rate in the range between about 200 sccm and about 250 sccm. When the flow rate of argon further increases, the uniformity decreases. Accordingly, the desired flow rate of argon may be found through experiments, for example, by removing dielectric layer 76 from a plurality of sample wafers having the same structures using different flow rate of dilute gases, so that the desirable pressure may be found. The production wafer may then be formed using the found desirable flow rate of dilute gases associated with the highest uniformity.

By adjusting the process conditions such as the wafer temperature distribution, the pressure, and the flow rate of dilute gases, the removal of the dielectric layer 76 may be substantially uniform.

In accordance with some embodiments, the removal of dielectric layer 76 is achieved in one reaction-and-sublimate cycle, in which the wafer 10 is placed into the first process chamber for equations 1 and 2 to occur, and then placed into the second process chamber for the third equation to occur. In accordance with alternative embodiments, the removal of dielectric layer includes a plurality of reaction-and-sublimate cycles, each for removing a portion of dielectric layer 76.

Figure 19C:
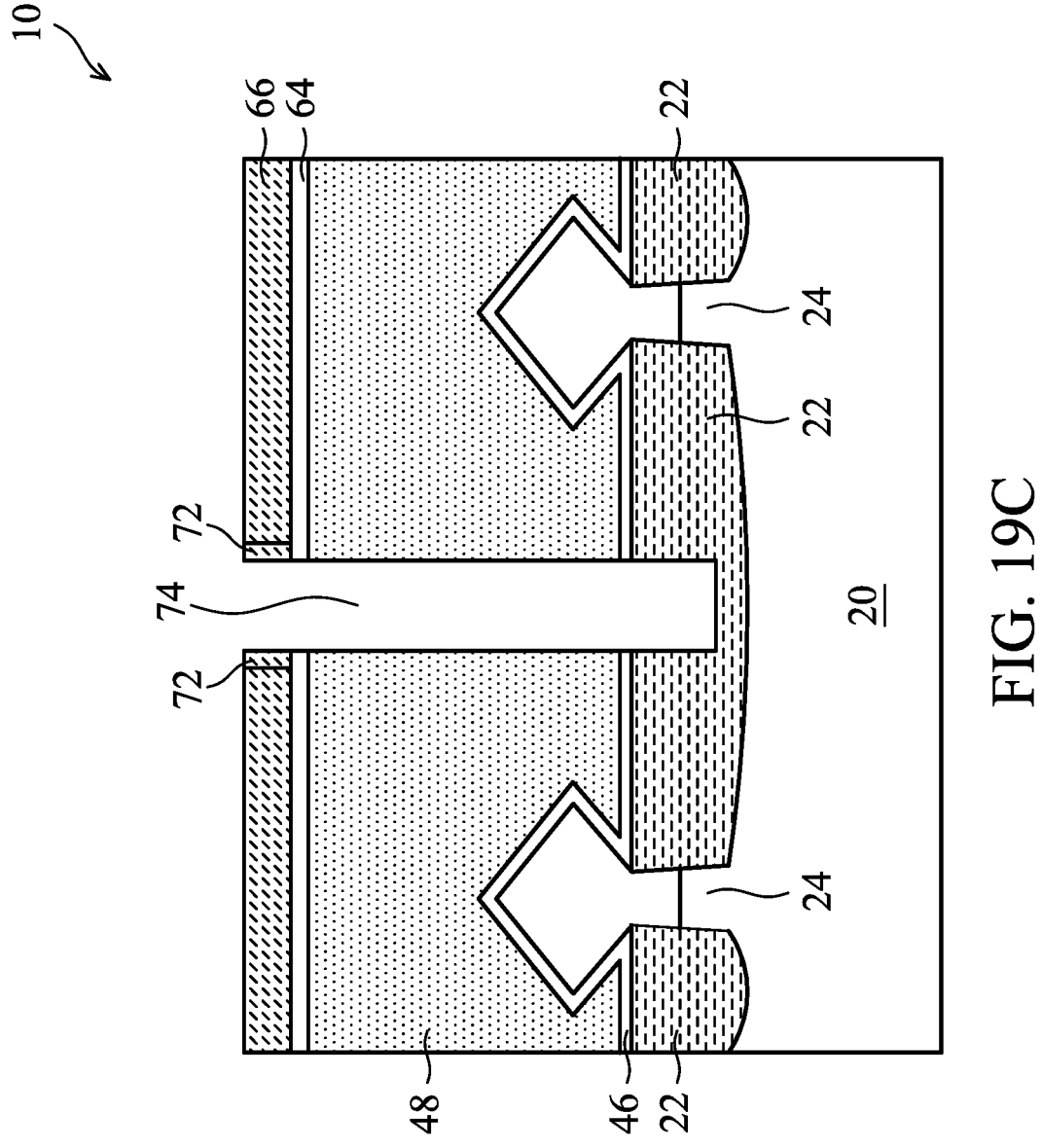

FIG. 19B illustrates wafer 10, in which dielectric layer 76 (FIG. 18) has been fully removed. FIGS. 19A and 19C illustrates the wafer 10 as shown in FIG. 19B, except that the cross-sectional views in FIGS. 19A and 19C are obtained from the same planes containing lines A-A and C-C in FIG. 9 (while the cross-sectional view in FIG. 19B is obtained from the line B-B in FIG. 9). In accordance with some embodiments of the present disclosure, ILD 48 and CESL 46 (FIGS. 19A and 19C) are also etched at the same time gate stack 60 (FIG. 19B) is etched. The etching rate of ILD 48 may be lower than the etching rate of gate stack 60. Accordingly, the portions of trench 74 formed by etching gate stack 60 may have depth D1 (FIG. 19A) greater than depth D2 of the portions of trench 74 formed by etching ILD 48.

Figure 20A:
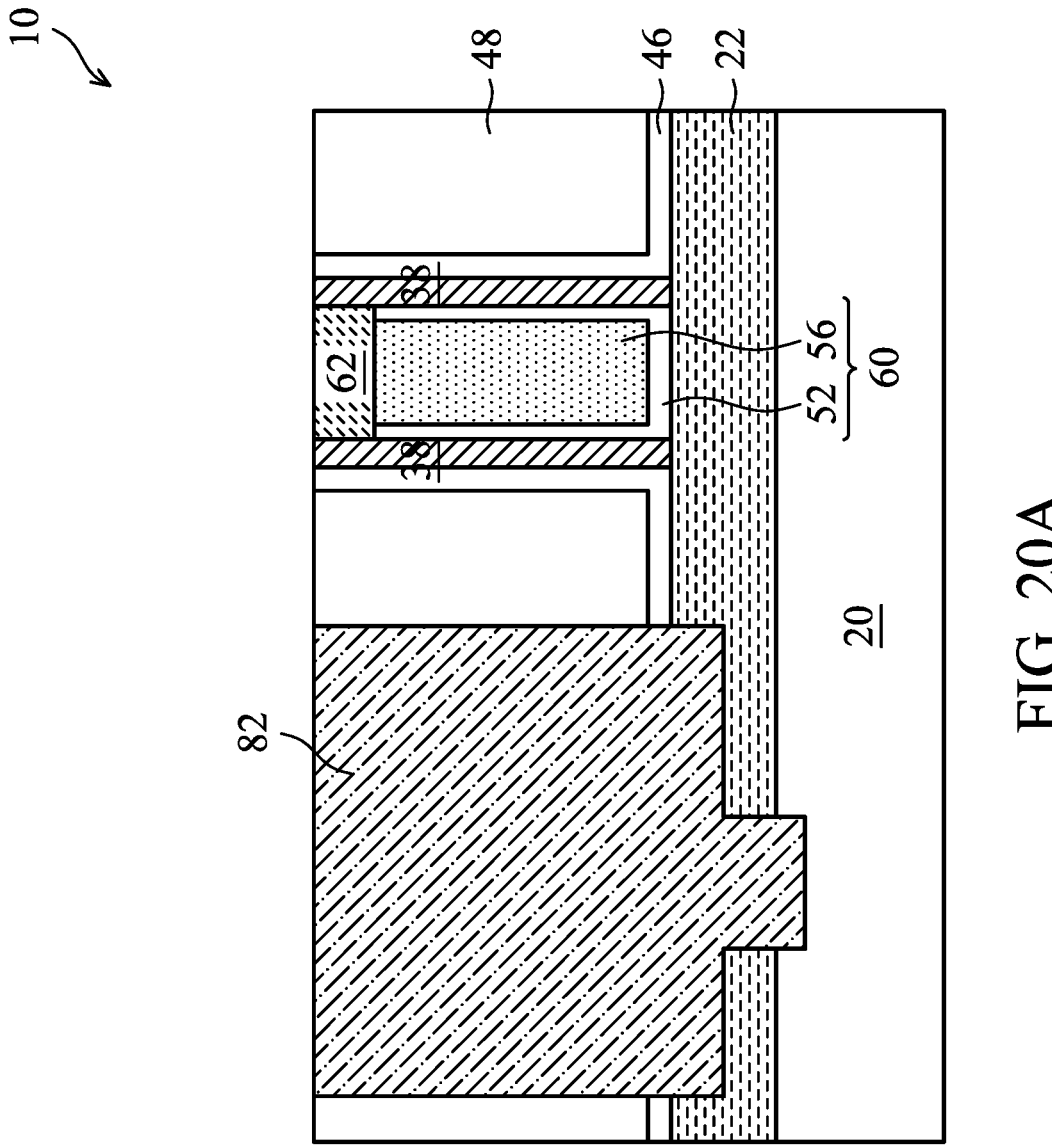
Figure 20B:
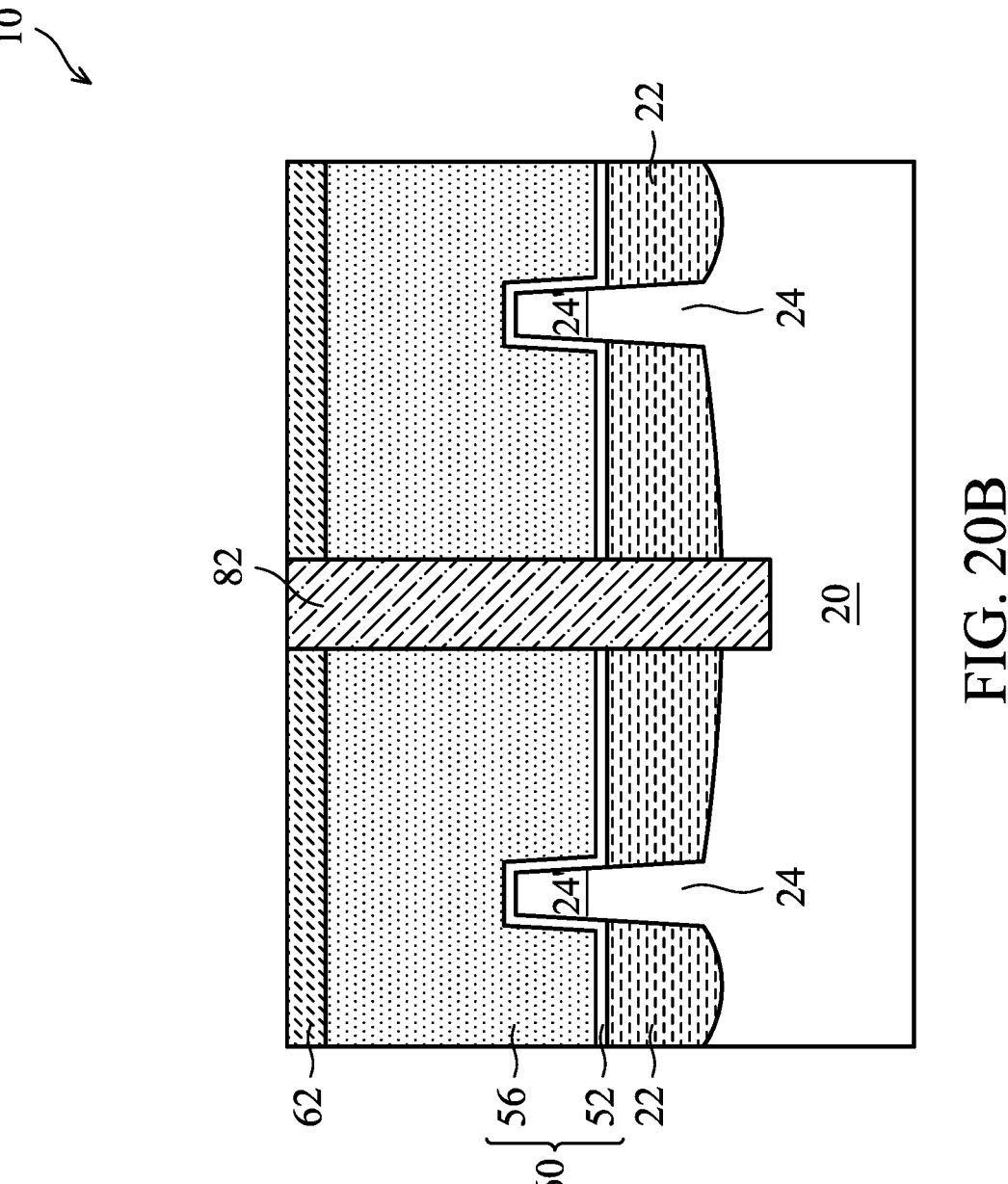
Figure 20C:
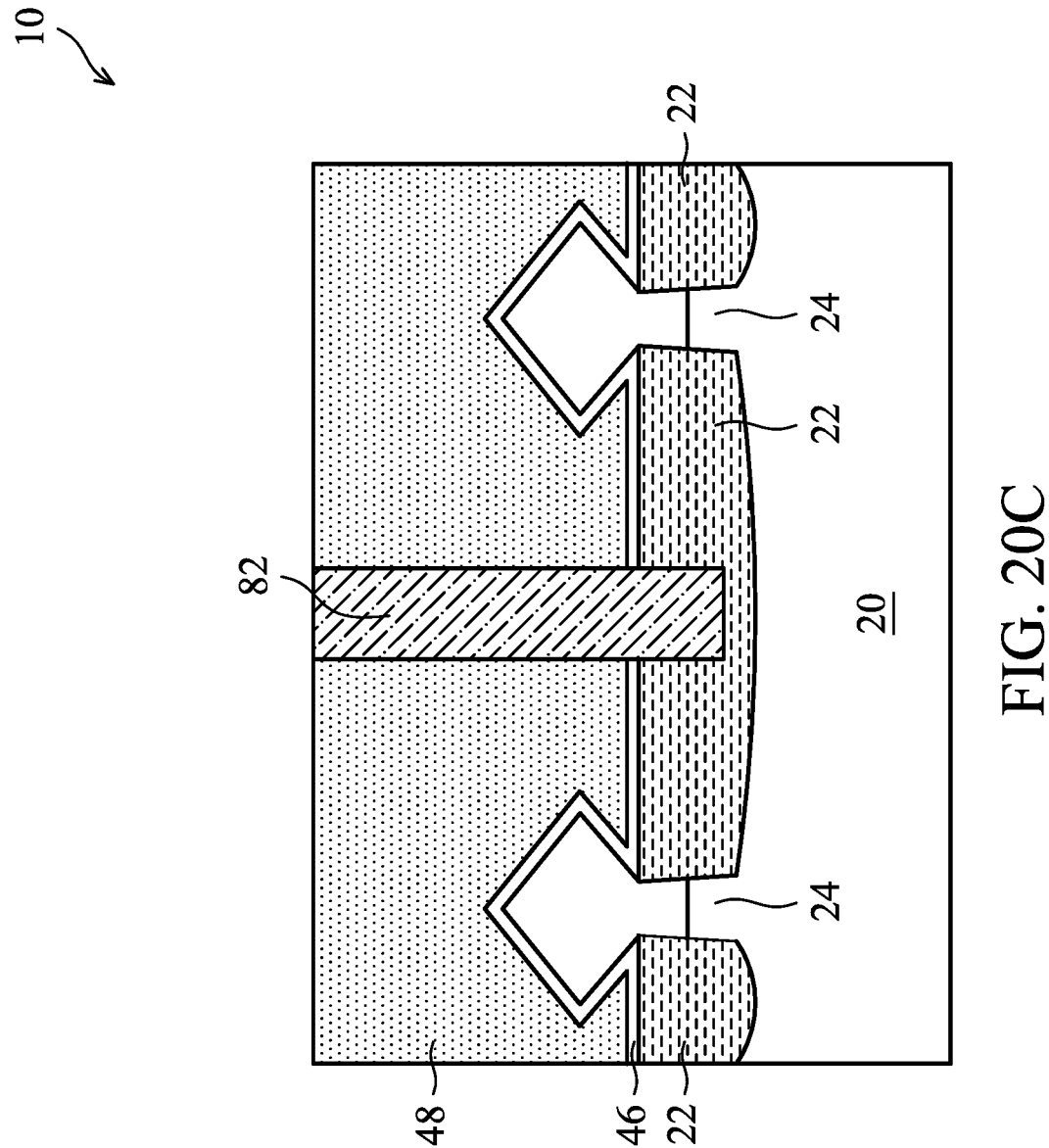

FIGS. 20A, 20B, and 20C illustrate the formation of dielectric (isolation) region 82. The respective process is illustrated as process 226 in the process flow 200 as shown in FIG. 25. The formation of dielectric (isolation) region 82 may include depositing a dielectric material into trench 74 (FIGS. 19A, 19B, and 19C), and performing a planarization such as a CMP process or a mechanical grinding process to remove the excess portions of the dielectric material. The filling method may include ALD, PECVD, CVD, spin-on coating, or the like. The filling material may include silicon nitride, silicon oxide, silicon carbide, silicon oxynitride, silicon oxy-carbide, or the like. Isolation region 82 is thus in physical contact with ILD 48, CESL 46, STI region 22, and substrate 20, with no dielectric layer (76) in between. Furthermore, isolation region 82 may have a composite structure including more than one layer (formed of different materials), or may have a homogeneous structure including a single layer formed of a homogenous material.

Figure 21:
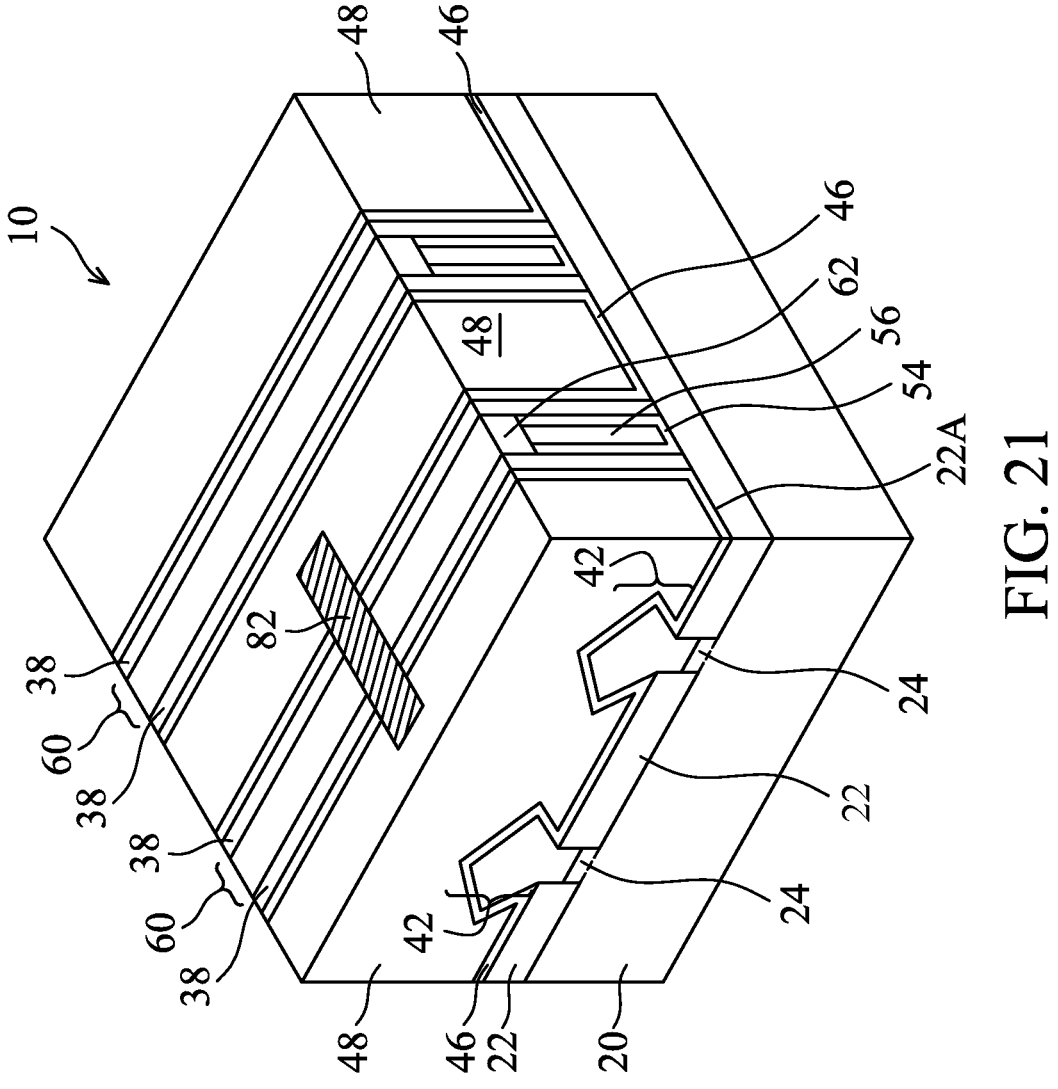

FIG. 21 illustrates a perspective view of wafer 10 and the dielectric region 82, which cuts the otherwise continuous gate stack 60, hard mask 62, and gate spacers 38 into separate portions.

The embodiments of the present disclosure have some advantageous features. By removing the dielectric layer from the trench before forming the isolation region in the trench, the uniformity in the threshold voltage throughout the wafer is improved. Experimental results indicated that the cut-metal-gate process adversely causes the shift in threshold voltage. Experimental results also indicated that if isolation region 82 is formed without removing the dielectric layer in the trench, the shift in the threshold voltages of the FinFETs near the isolation regions may be about 60 mV or higher. With the dielectric layer removed before filling the isolation regions, the shift in the threshold voltages of the FinFETs near the isolation regions is reduced to about 30 mV.

In accordance with some embodiments of the present disclosure, a method of forming a semiconductor device incudes etching a gate stack to form a trench extending into the gate stack; forming a dielectric layer on a sidewall of the gate stack, with the sidewall exposed to the trench; etching the dielectric layer to remove a first portion of the dielectric layer at a bottom of the trench, wherein a second portion of the dielectric layer on the sidewall of the gate stack remains after the dielectric layer is etched; after the first portion of the dielectric layer is removed, removing the second portion of the dielectric layer to reveal the sidewall of the gate stack; and filling the trench with a dielectric material to form a dielectric region, wherein the dielectric region contacts the sidewall of the gate stack. In an embodiment, the forming the dielectric layer comprises forming a silicon oxide layer. In an embodiment, the dielectric layer is formed using a process gas comprising $SiCl_4$ and $O_2$. In an embodiment, the dielectric region filling the trench comprises silicon nitride. In an embodiment, when the trench is filled with the dielectric region, the dielectric layer has been fully removed from the trench. In an embodiment, the removing the second portion of the dielectric layer comprises: reacting the second portion of the dielectric layer with a process gas to form a solid layer; and sublimating the solid layer. In an embodiment, when the second portion of the dielectric layer is reacted with the process gas, a center portion of a respective wafer is at a first temperature lower than a second temperature of a peripheral region of the wafer. In an embodiment, the second temperature is higher than the first temperature by a temperature difference smaller than about 15 degrees.

In accordance with some embodiments of the present disclosure, a method of forming a semiconductor device includes forming a dummy gate stack on a semiconductor fin; forming a CESL; forming an ILD over the CESL, wherein the dummy gate stack is in the ILD and the CESL; replacing the dummy gate stack with a replacement gate stack; etching the replacement gate stack to form a trench penetrating through the replacement gate stack; depositing an oxide layer on a sidewall of the replacement gate stack, wherein the sidewall is exposed to the trench; further etching the replacement gate stack, wherein the oxide layer protects the sidewall of the replacement gate stack from the further etching; removing the oxide layer from the trench; depositing a dielectric material into the trench; and planarizing the dielectric material to leave a dielectric region in the trench. In an embodiment, the method further comprises, before the removing the oxide layer, removing a polymer layer from the trench. In an embodiment, the polymer layer is removed using oxygen. In an embodiment, the removing the oxide layer comprises: reacting the oxide layer with HF and ammonia to form a solid layer; and sublimating the solid layer. In an embodiment, when the oxide layer reacts with HF and ammonia, a respective wafer including the oxide layer therein has a center portion having a temperature lower than a temperature of a peripheral portion of the wafer that encircles the center portion. In an embodiment, after the dielectric region is formed in the trench, the dielectric region contacts the sidewall of the replacement gate stack. In an embodiment, when the replacement gate stack is etched to form the trench, the ILD is also etched, so that the trench penetrates through the ILD. In an embodiment, the method further comprises: forming a patterned hard mask having an opening therein; and forming a conformal hard mask layer extending into the opening, wherein the replacement gate stack is etched using the patterned hard mask and the conformal hard mask layer as an etching mask.

In accordance with some embodiments of the present disclosure, a method of forming a semiconductor device incudes etching a conductive region to form a trench; depositing a silicon oxide layer on a sidewall of the trench; reacting the silicon oxide layer with HF and ammonia to form a solid layer; heating the solid layer to sublimate the solid layer, so that sidewalls of the conductive region are exposed to the trench; and filling a dielectric region in the trench. In an embodiment, the silicon oxide layer is formed using a process gas comprising $SiCl_4$ and $O_2$. In an embodiment, the method further comprises, before the reacting the silicon oxide layer, removing all polymer from the trench. In an embodiment, the trench penetrates through the conductive region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
performing a plurality of cycles to form a trench in a feature, wherein the plurality of cycles comprise:
depositing a dielectric layer; and
etching a portion of the feature underlying a bottom portion of the dielectric layer to extend the trench downwardly;
removing the dielectric layer from the trench, wherein the removing the dielectric layer comprises a sublimation process; and
filling the trench with a dielectric material to form a dielectric isolation region.

2. The method of claim 1, wherein the dielectric layer and the dielectric material comprise a same dielectric material.

3. The method of claim 2, wherein the dielectric layer and the dielectric material comprise silicon oxide.

4. The method of claim 1, wherein the removing the dielectric layer comprises:
reacting the dielectric layer with a gas to form a solid layer; and
performing the sublimation process by baking a wafer that comprises the dielectric layer.

5. The method of claim 4, wherein the reacting the dielectric layer with the gas comprises reacting silicon oxide with hydrogen fluoride and ammonia.

6. The method of claim 4, wherein the baking the wafer is performed at a temperature higher than about 100° C.

7. The method of claim 1, wherein the feature that is etched by the plurality of cycles comprises a gate stack, and wherein after the dielectric layer is removed, sidewalls of the gate stack are exposed to the trench.

8. The method of claim 1, wherein the dielectric layer is deposited using process gases comprising $SiCl_4$ and $O_2$.

9. The method of claim 1, wherein an entirety of the dielectric layer is removed from the trench.

10. The method of claim 1, wherein in each of the plurality of cycles, the trench extends down vertically.

11. A method comprising:

forming a gate stack on a semiconductor fin, wherein the semiconductor fin is over a bulk portion of a semiconductor substrate;

forming a Contact Etch Stop Layer (CESL) on opposing sides of the gate stack;

forming an Inter-Layer Dielectric (ILD) on the CESL;

forming a trench in the gate stack, wherein during the forming the trench, a dielectric layer is formed in the trench, and wherein the trench and the dielectric layer penetrate through the gate stack;

removing the dielectric layer comprising:

converting the dielectric layer into a solid layer; and baking the solid layer as a gas; and depositing a dielectric material into the trench.

12. The method of claim 11, wherein the forming the trench comprises a plurality of cycles, each comprising:

depositing a portion of the dielectric layer; and etching a portion of the gate stack and a bottom portion of the dielectric layer at a bottom of the trench to extend the trench downwardly.

13. The method of claim 11 further comprising, when the gate stack is etched, etching gate spacers that are on sidewalls of the gate stack to extend the trench into the gate spacers, wherein portions of the dielectric layer in the trench and on the gate spacers are also removed.

14. The method of claim 11 further comprising, when the gate stack is etched, etching portions of the ILD on a side of the gate stack to extend the trench into the ILD, wherein portions of the dielectric layer in the trench and on the ILD are also removed.

15. The method of claim 11, wherein the trench further extends into a dielectric isolation region that is underlying the gate stack.

16. The method of claim 11, wherein the removing the dielectric layer comprises removing silicon oxide, and the depositing the dielectric material also comprises depositing silicon oxide.

17. The method of claim 11, wherein the dielectric layer comprises portions on sidewalls of the bulk portion of the semiconductor substrate.

18. A method comprising:

forming a conductive region over a shallow trench isolation region;

forming an inter-layer dielectric, wherein the conductive region is in the inter-layer dielectric;

forming a trench in the conductive region, wherein at a time the forming the trench is finished, a dielectric layer is left in the trench, wherein the trench extends into a semiconductor substrate underlying the shallow trench isolation region, and the dielectric layer covers first sidewalls of the conductive region;

reacting the dielectric layer with a gas to form an additional layer;

removing the additional layer through a baking process; and filling a dielectric isolation region into the trench, wherein second sidewalls of the semiconductor substrate are exposed to the trench when the dielectric layer starts to be reacted with the gas.

19. The method of claim 18, wherein the conductive region comprises a gate stack, and wherein the dielectric isolation region electrically insulates two portions of the gate stack from each other.

20. The method of claim 18, wherein at a time the dielectric layer starts to be reacted with the gas, a bottommost end of the dielectric layer is higher than a bottom of the trench.

* * * * *